US011196409B2

(12) United States Patent
Archibald et al.

(10) Patent No.: US 11,196,409 B2
(45) Date of Patent: *Dec. 7, 2021

(54) SLOPE COMPENSATION FOR CURRENT MODE CONTROL MODULATOR

(71) Applicant: Alpha and Omega Semiconductor (Cayman) Ltd., Grand Cayman (KY)

(72) Inventors: Nicholas I. Archibald, San Francisco, CA (US); Rhys S. A. Philbrick, Los Gatos, CA (US); Steven P. Laur, Raleigh, NC (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 17/035,012

(22) Filed: Sep. 28, 2020

(65) Prior Publication Data

US 2021/0175879 A1    Jun. 10, 2021

Related U.S. Application Data

(63) Continuation of application No. 16/703,715, filed on Dec. 4, 2019, now Pat. No. 10,833,661.

(51) Int. Cl.
  *H03K 4/08*   (2006.01)
  *H03K 3/017*  (2006.01)
  *H03K 3/037*  (2006.01)

(52) U.S. Cl.
  CPC ............. *H03K 4/08* (2013.01); *H03K 3/017* (2013.01); *H03K 3/037* (2013.01)

(58) Field of Classification Search
  CPC ............ H03K 3/017; H03K 4/50; H03K 4/06; H03K 17/082; H03K 4/023; H03K 5/01

USPC ................................. 327/130, 131, 134–140
  See application file for complete search history.

(56) References Cited

U.S. PATENT DOCUMENTS

| 4,837,495 A | 6/1989 | Zansky |
| 4,975,820 A | 12/1990 | Szepesi |
| 6,369,665 B1 | 4/2002 | Chee et al. |
| 7,378,822 B2 | 5/2008 | Liao |
| 8,278,830 B2 | 10/2012 | Archibald et al. |

(Continued)

FOREIGN PATENT DOCUMENTS

| EP | 3327916 A1 | 5/2018 |
| TW | I330923 B | 9/2010 |

OTHER PUBLICATIONS

Compensation Design for Peak current-Mode buck Converters, Richtek, Richtek Technology Corporation, Hsinchu, Taiwan, ANO28—Apr. 2014, pp. 1-13.

(Continued)

*Primary Examiner* — Hai L Nguyen
(74) *Attorney, Agent, or Firm* — Carmen C. Cook

(57) ABSTRACT

A ramp signal generator generates a slope compensated ramp signal with optimal slope compensation for a current mode control modulator. In some embodiments, the ramp signal generator generates a ramp signal for the current control loop having a first ramp portion with slope compensation and a second ramp portion that matches the expected current mode signal. In some embodiments, the ramp signal generator is implemented using a switched capacitor circuit with charge scaling to generate the ramp signal with optimal slope compensation built into the ramp signal.

20 Claims, 12 Drawing Sheets

(56) References Cited

U.S. PATENT DOCUMENTS

| | | | |
|---|---|---|---|
| 8,686,702 B2 | 4/2014 | Engelhardt | |
| 9,467,051 B2 | 10/2016 | Stoichita et al. | |
| 10,833,661 B1 * | 11/2020 | Archibald | H03K 3/037 |
| 10,924,013 B1 * | 2/2021 | Laur | H02M 3/1584 |
| 2009/0309557 A1 | 12/2009 | Miyamae et al. | |
| 2011/0241641 A1 | 10/2011 | Chen et al. | |
| 2013/0088209 A1 | 4/2013 | Hang et al. | |
| 2014/0049239 A1 | 2/2014 | Labbe | |
| 2015/0256078 A1 | 9/2015 | Tanabe | |
| 2017/0025947 A1 | 1/2017 | Wang et al. | |
| 2017/0288539 A1 | 10/2017 | Liu et al. | |

OTHER PUBLICATIONS

Keeping, Steven, The Role of Slope Compensation in current-Mode-Controlled Voltage Regulators, Contributed by Electronic Products, Thief River Falls, MN, Jan. 20, 2015, 6 pgs.

Munoz, Juan-Guillermo G, et al. "Slope Compensation Design for a Peak Current-Mode Controlled Boost-Flyback Converter." Energies, vol. 11, No. 11, 2018, pp. Energies, Nov. 1, 2018, vol. 11(11).

Ridley, R.B. "A New, Continuous-Time Model for Current-Mode Control (Power Convertors)." IEEE Transactions on Power Electronics, vol. 6, No. 2, 1991, pp. 271-280.

Sheehan, Robert, "Emulated Current Mode Conlrol for buck regulators Using Sample and Hold Technique: Small Signal Linear Analysis and Comparison to Peak and Valley Methods," Texas Instruments, LM3495, No. SNVA537, Power Electronics Technology Exhibition and Conference, Oct. 24, 2006, Long Beach, CA. 51 pgs.

Sheehan, Robert. "Part One: A New Way to Model Current-Mode Control." Power Electronics Technology, vol. 33, No. 5, May 2007, pp. 14-20.

Sheehan, Robert. "Part Two: A New Way to Model Current-Mode Control." Power Electronics Technology, vol. 33, No. 6, Jun. 2007, pp. 22-32.

Sheehan, Robert. "Understanding and Applying Current-Mode Control Theory: Practical Design Guide for Fixed-Frequency, Continous Conduction-Mode Operation." Texas Instruments, No. SNVA555, Pwers Electronics Technology Exhibition and Conference, Oct. 31, 2007, Dallas, TX, 30 pgs.

Office Action and Search Report for Taiwan Application No. 109142720, dated May 29, 2021, 4 pages.

* cited by examiner

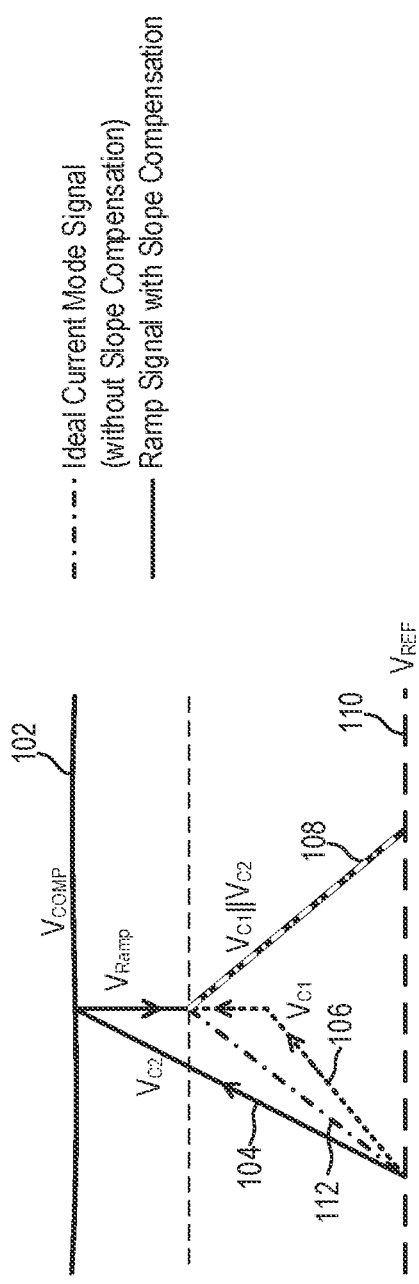
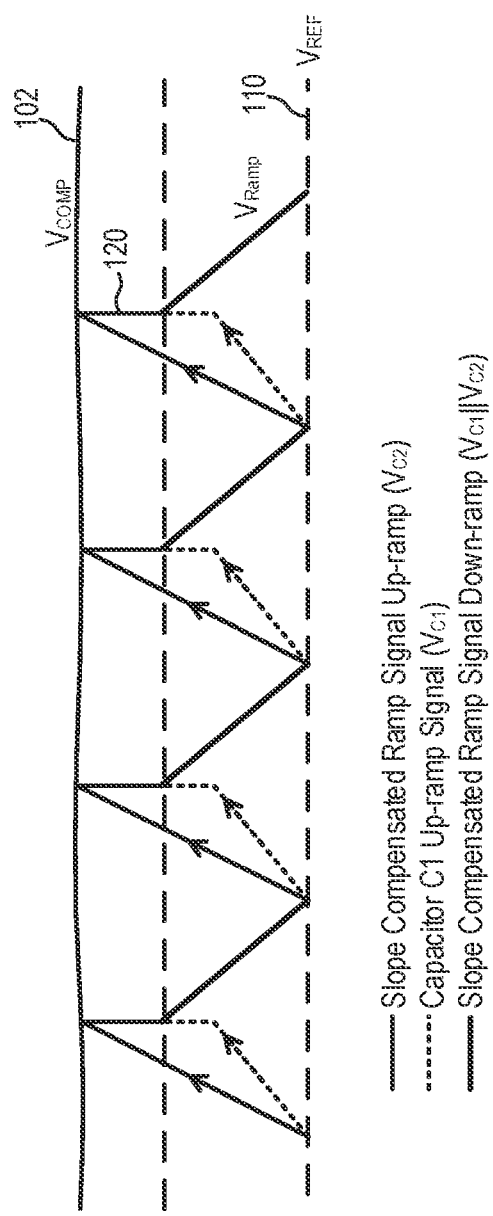
Fig. 8(a)
Fig. 8(b)
Fig. 8

SLOPE COMPENSATION FOR CURRENT MODE CONTROL MODULATOR

CROSS REFERENCE TO OTHER APPLICATIONS

This application is a continuation of U.S. patent application Ser. No. 16/703,715, entitled SLOPE COMPENSATION FOR PEAK CURRENT MODE CONTROL MODULATOR, filed Dec. 4, 2019, now U.S. Pat. No. 10,833,661, issued Nov. 10, 2020, which is incorporated herein by reference for all purposes.

FIELD OF THE INVENTION

The invention relates to current mode control modulators and, in particular, to providing slope compensation in current mode control modulators.

BACKGROUND OF THE INVENTION

Electronic systems incorporating integrated circuits typically employ voltage regulators to convert a main bus voltage from a power source supplying the system to one or more voltages necessary for driving the integrated circuits therein. For example, a 5 volts supply voltage provided to an electronic system may need to be reduced to 1.8 volts to drive an integrated circuit in the electronic system. Embedded systems, such as Internet of Things (IoT) devices, include processors (or microcontrollers) and local memory coupled to components and executing embedded software to perform certain tasks. In practice, the processor power supply is provided by a voltage regulator converting an input voltage from a power source to a voltage value specified for the processor. In some cases, the microcontrollers or processors used in these embedded systems implement mobile voltage positioning to allow the processor to control or select its own operating voltage (Vcc). The processor generates a multi-bit voltage identification code to inform the voltage regulator what the regulator output voltage should be at any instant. In this manner, the processor may dynamically adjust the processor supply voltage (Vcc) based on processor activity to reduce processor power consumption. For example, the processor may adjust the processor supply voltage to maintain a higher processor clock speed at a given power consumption, or the processor may adjust the processor supply voltage to lower power consumption at a given clock frequency.

Switch mode power supplies or switching regulators, also referred to as DC to DC converters, are a type of voltage regulators often used to convert an input supply voltage to a desired output voltage at a voltage level selected for an integrated circuit. In one example, a 12V or 5V supply voltage may be reduced to 1V for supplying an embedded processor. A switching regulator provides power supply function through low loss components such as capacitors, inductors, and transformers, and power switches that are turned on and off to transfer energy from the input to the output, sometimes in discrete packets. A feedback control circuit is used to regulate the energy transfer to maintain a constant output voltage within the desired load limits of the circuit.

The operation of the conventional switching regulator is well known and can be generalized as follows. For a step down (or buck) switching regulator, the switching regulator includes a pair of power switches which are turned on and off to regulate an output voltage to be equal to a reference voltage where the output voltage is less than the input voltage. More specifically, the power switches are alternately turned on and off to generate a switching output voltage at a switching output node, also referred to as the switch node. The switch node is coupled to an LC filter circuit including an output inductor and an output capacitor to generate an output voltage having substantially constant magnitude. The output voltage can then be used to drive a load.

A wide variety of control methods can be applied to switching regulators. One type of switching regulator control scheme is current mode control where the switching regulator modulates the peak current or the valley current in the output inductor in order to deliver the required energy to the load to maintain the desired output voltage. In current mode control, the inductor or power switch current is sensed and the sensed current is compared to a current loop error signal to control the turning on or off of the high-side power switch.

In some cases, the current control loop of current mode control switching regulators using peak current mode or valley current mode needs a slope compensation signal added to the sensed current in order to achieve stable operation. The stabilizing effect of the slope compensation signal manifests itself through the slew rate of the slope compensation signal compared with inductor current slew rate.

Some switching regulators employ pulse width modulation (PWM) to control the duty cycle of the power switches. That is, the on-time of power switches may be controlled at a given fixed or variable frequency by adjusting the pulse width. Switching regulators employing PWM control include a PWM controller or modulator to drive a power block including the power switches, the driver circuit for the power switches and the LC filter circuit.

In some cases, the switching regulator is a single phase converter and the PWM controller generates a single phase PWM clock signal to drive a single phase power block. In other cases, the switching regulator is a multi-phase converter and a multi-phase PWM controller generates clock signals with different phase shifts to drive a multi-phase power block, each clock signal driving a respective power block cell. Multi-phase PWM controllers are desirable when the voltage regulator has to deliver a regulated output voltage with high precision over a wide range of load conditions.

BRIEF DESCRIPTION OF THE DRAWINGS

Various embodiments of the invention are disclosed in the following detailed description and the accompanying drawings.

FIG. 8, which includes FIGS. 8(*a*) and 8(*b*), illustrates the ramp signal generated by the ramp signal generator of FIG. 7 in some examples.

DETAILED DESCRIPTION

According to embodiments of the present invention, a ramp signal generator generates a slope compensated ramp signal with optimal slope compensation for a current mode control modulator. In some embodiments, the ramp signal generator generates a ramp signal for the current control loop having a first ramp portion incorporating slope compensation and a second ramp portion matching the expected current mode signal. In some embodiments, the ramp signal generator is implemented using a switched capacitor circuit with appropriate charge scaling to generate the ramp signal with optimal slope compensation.

In some embodiments, the current mode control modulator with the ramp signal generator is applied in a switching regulator to generate a regulated output voltage from an input voltage. The current mode control modulator generates a pulse-width modulation signal having a given duty cycle in response to the ramp signal. The current mode control modulator can be applied in a buck switching regulator, a boost switching regulator, or a buck-boost switching regulator. Furthermore, in embodiments of the present disclosure, the current mode control modulator can be applied in a modulator implementing peak current mode control or valley current mode control.

In some embodiments, the ramp signal generator is incorporated in a current mode control voltage regulator for providing an emulated or synthesized current mode signal for the current control loop. In one embodiment, the ramp signal generator of the present disclosure is incorporated in a current mode hysteretic modulator to generate the ramp signal for generating the pulse-width modulation signal ("PWM signal") at the modulator. In one example, the current mode hysteretic modulator implements peak current control and the ramp signal is used by the current mode hysteretic modulator to terminate the on-duration of the PWM signal of the modulator. The ramp signal generator of the present disclosure uses simplified circuitry and is effective in providing the optimal amount of slope compensation to the ramp signal.

Figure 1:
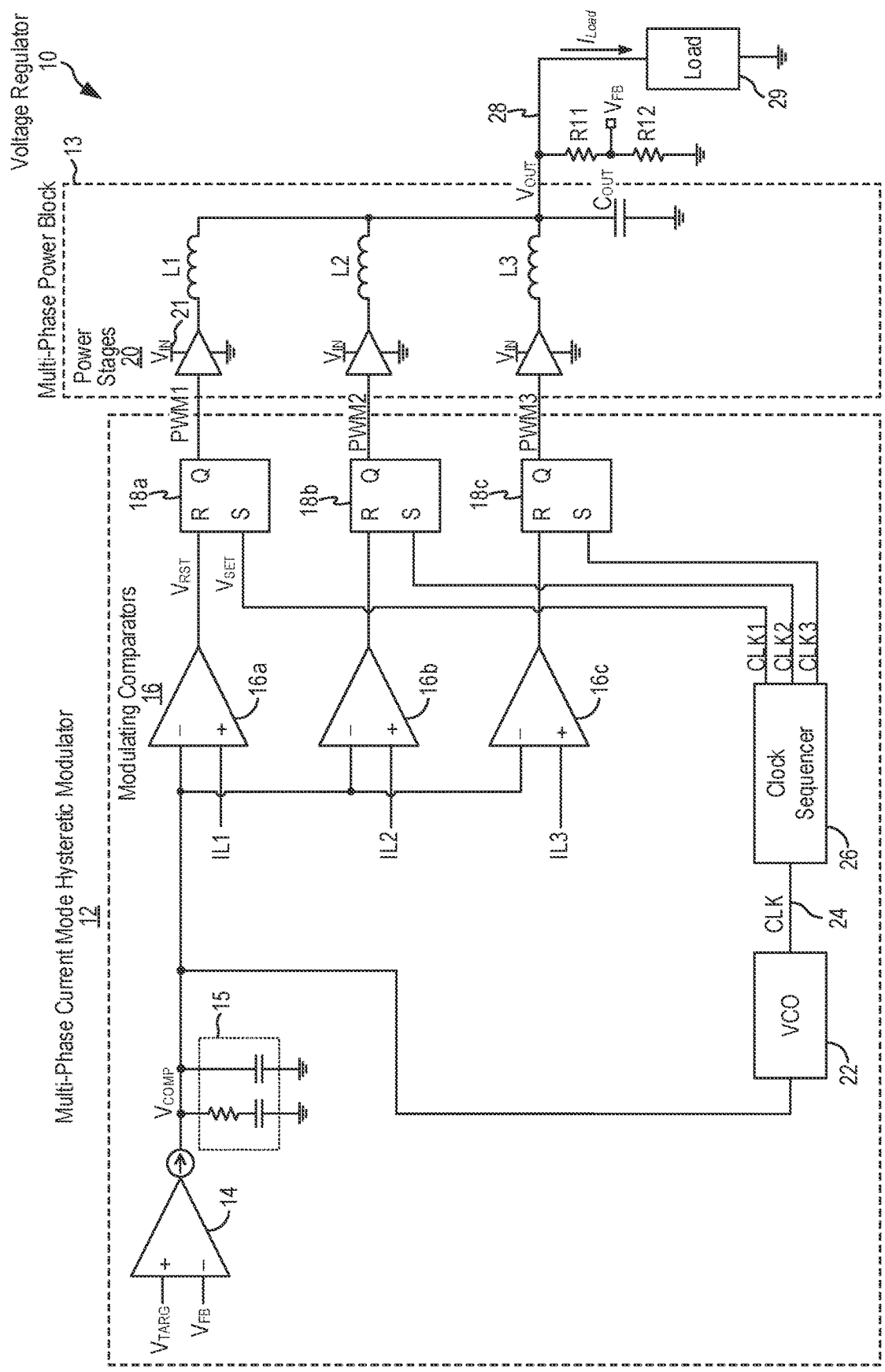
FIG. 1 is a schematic diagram of a voltage regulator incorporating a multi-phase current mode hysteretic modulator in some examples.

FIG. 1 is a schematic diagram of a voltage regulator incorporating a multi-phase current mode hysteretic modulator in some examples. Referring to FIG. 1, a voltage regulator 10 includes a multi-phase current mode hysteretic modulator 12 ("modulator 12") coupled to drive a multi-phase power block 13. In the present example, the voltage regulator 10 is implemented using a multi-phase modulator to enable the voltage regulator to deliver a regulated output voltage with high precision over a wide range of load conditions. The use of a multi-phase modulator is illustrative only and not intended to be limiting. In other examples, the voltage regulator can be implemented using a single phase current mode hysteretic modulator driving a single phase power block. In the present example, the multi-phase modulator 12 includes three phases and the power block 13 includes three power stages 20 with associated output inductors L1 to L3 and an output capacitor $C_{OUT}$.

More specifically, the voltage regulator 10 receives an input voltage $V_{IN}$ on an input node 21 and generates a regulated output voltage $V_{OUT}$ on an output node 28 to supply a load 29. The multi-phase power block 13 includes power stages 20 driven by respective PWM signals PWM1 to PWM3. Each power stage 20 includes a pair of power switches which are turned on and off by the respective PWM signal to regulate the output voltage $V_{OUT}$ with reference to a target voltage. The power switches in each power stage 20 are alternately turned on and off to generate a switching output voltage at a switching output node. The switching output node for each power stage 20 is coupled to respective output inductor L1 to L3. The inductors L1 to L3 are coupled to the output capacitor $C_{OUT}$ to form an LC circuit for providing current to the output node 28 while maintaining a substantially constant output voltage $V_{OUT}$. The output voltage $V_{OUT}$ can then be used to drive the load 29.

The current mode hysteretic modulator 12 receives a feedback voltage $V_{FB}$ indicative of the regulated output voltage $V_{OUT}$ on output ode 28. In one example, the feedback voltage $V_{FB}$ is a stepped down voltage of the output voltage $V_{OUT}$. For example, the feedback voltage $V_{FB}$ can be generated using a resistor divider including resistors R11 and R12 coupled to the output voltage node 28. The current mode hysteretic modulator 12 also receives a target voltage $V_{TARG}$ indicative of the voltage value desired for the regulated output voltage. In some examples, the target voltage may be indicated by a voltage identification code signaling the desired regulator output voltage. For instance, when applied in mobile voltage positioning, the modulator 12 may receive a voltage identification (VID) code that tells the modulator what output voltage it should provide. Each VID code is associated with a voltage value. A decoder decodes the code to generate the target voltage.

At the modulator 12, the feedback voltage $V_{FB}$ is compared to the target voltage $V_{TARG}$ at an error amplifier 14 to generate a control loop error signal $V_{COMP}$. The error signal $V_{CO}$MP can be a voltage signal or a current signal. In the present example, the error amplifier 14 generates an output current which is converted to a voltage signal by a loop filter 15. The error signal $V_{COMP}$ is therefore a voltage signal in the present example. The error signal $V_{COMP}$ is provided to the inverting input terminals of a set of modulating comparators 16a-c, each modulating comparator corresponding to one phase of the multi-phase control loop. In the present example, each modulating comparator 16 receives a sensed current signal from the respective power stage 20 at the non-inverting input terminal. The voltage signal ILn is indicative of the inductor current at the respective power stages 20. For example, the first modulating comparator 16a receives a voltage signal IL1 at the non-inverting input terminal where the voltage signal IL1 is indicative of the current flowing through output inductor L1.

The modulator comparators 16a-c generate the reset voltage signal $V_{RST}$ coupled to the Reset input terminal of the respective latch circuit 18a-c. In the present embodiment, the latch circuits 18a-c are flip-flops. The Set input terminals of the latch circuit 18a-c receive a set voltage signal $V_{SET}$ being a clock signal CLK1-CLK3 having the respective phase. The latch circuits 18a-c generate the multi-phase PWM signals PWM1 to PWM3 to drive the respective power stages 20 in the multi-phase power block 13.

In one example, a voltage-controlled oscillator (VCO) 22 receives the control loop error signal $V_{COMP}$ and generates a clock signal CLK (node 24) in response to changes in the error signal. In the multi-phase modulator 12, the clock signal CLK is provided to a clock sequencer 26 to separate into multiple clock signals CLK1 to CLK3 having different phases. In some examples, the VCO 22 operates to provide variable switching frequency control in modulator 12 to enable the voltage regulator to be more responsive to load changes.

Figure 2:
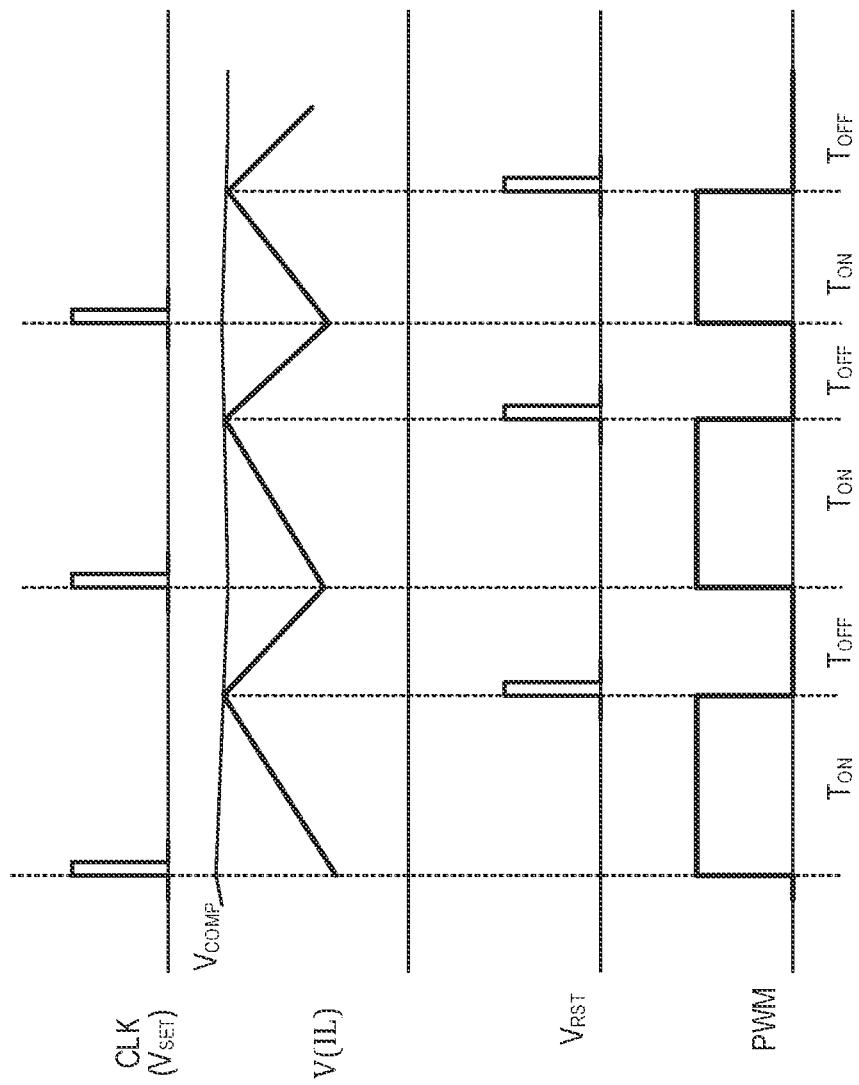
FIG. 2 illustrates the operating signals in a current mode hysteretic modulator in some examples.

As thus constructed, the current mode hysteretic modulator 12 implements a voltage control loop through the feedback voltage $V_{FB}$ and a current control loop through the sensed current signal ILn. The operation of the modulator 12 to generate the PWM signals PWM1-3 is described with reference to FIG. 2. FIG. 2 illustrates the operating signals in a current mode hysteretic modulator for a single phase clock signal in some examples. In particular, FIG. 2 illustrates the operation of the current mode hysteretic modulator implementing peak current control. Referring to FIG. 2, the clock signal CLK is generated in response to error signal $V_{COMP}$. When the clock signal CLK is asserted, the PWM signal starts a new duty cycle. That is, the clock signal CLK, being the set voltage signal $V_{SET}$, triggers the on-duration of the PWM signal. The sensed current IL is measured and compared against the error signal $V_{COMP}$. When sensed current IL reaches the error signal $V_{COMP}$, the reset voltage signal $V_{RST}$ is triggered which terminates the on-duration of the PWM signal. In this manner, the duty cycle of the PWM signal is controlled by the clock signal CLK and the sensed current signal. In particular, the clock signal CLK determines the PWM signal frequency and the sensed current signal determines the duty cycle of the PWM signal—that is, the percentage of time the power switch in the power stage is ON relative to the total period of the switching cycle. By controlling the duty cycle of the power switches in the power stage, the switching voltage regulator can regulate the output voltage.

In the present description, references to the "on-duration" of the PWM signal refers to the logical state of the PWM signal associated with the charge phase of the output inductor where the inductor current increases or ramps up (i.e. charging of the inductor by the power switches of the switching regulator). That is, the on-duration of the PWM signal is associated with the charge phase or the up-ramp of the inductor current. Meanwhile, references to the "off-duration" of the PWM signal refers to the logical state of the PWM signal associated with the discharge phase of the output inductor where the inductor current decreases or ramps down (i.e. discharging of the inductor by current flowing to the load). That is, the off-duration of the PWM signal is associated with the discharge phase or the down-ramp of the inductor current. In a peak current mode modulator, the modulator monitors the up-ramp of the inductor current to regulate the end of the on-duration of the PWM signal. In a valley current mode modulator, the modulator monitors the down-ramp of the inductor current to regulate the end of the off-duration of the PWM signal.

In a current mode control voltage regulator, the difference between the average inductor current and the dc value of the sensed inductor current can cause instability under certain operating conditions. The instability is sometimes referred to as subharmonic oscillation, which occurs when the inductor ripple current does not return to its initial value by the start of the next switching cycle under steady state load conditions. The instability is particularly problematic when the duty cycle exceeds 50%, that is, when the power switch is ON for more than 50% of a given switching period. To ensure stability, a slope compensation ramp is added to the current-sense signal to prevent or eliminate the subharmonic oscillation. In some examples, the slope compensation ramp is subtracted from the error signal $V_{COMP}$ window. For instance, by adding a compensating ramp signal to the sensed current signal, tendency towards subharmonic oscillation can be damped within one switching cycle.

In FIG. 1, the current mode hysteretic modulator 12 implements a voltage control loop through the feedback voltage $V_{FB}$ and a current control loop through the sensed current signal ILn. In the example shown in FIG. 1, the current control loop is implemented by receiving a sensed current signal ILn indicative of the inductor current at the inductors Ln of the respective power stages 20. In other examples, the current control loop of the modulator 12 can be implemented using an emulated or synthesized current sense signal. That is, the modulator 12 does not have to receive a sensed inductor current value for the current control loop. Instead, the modulator 12 generates a current loop signal indicative of an expected inductor current waveform for the current control loop. In the present description, the expected inductor current waveform is referred to as the current mode signal or the current loop signal and is indicative of the expected inductor current behavior at the power block stage of the voltage regulator. In one example, the current loop signal is a ramp signal replicating the expected inductor current waveform. In some implementation, a slope compensation circuit is used to generate the synthesized ramp signal.

Figure 3:
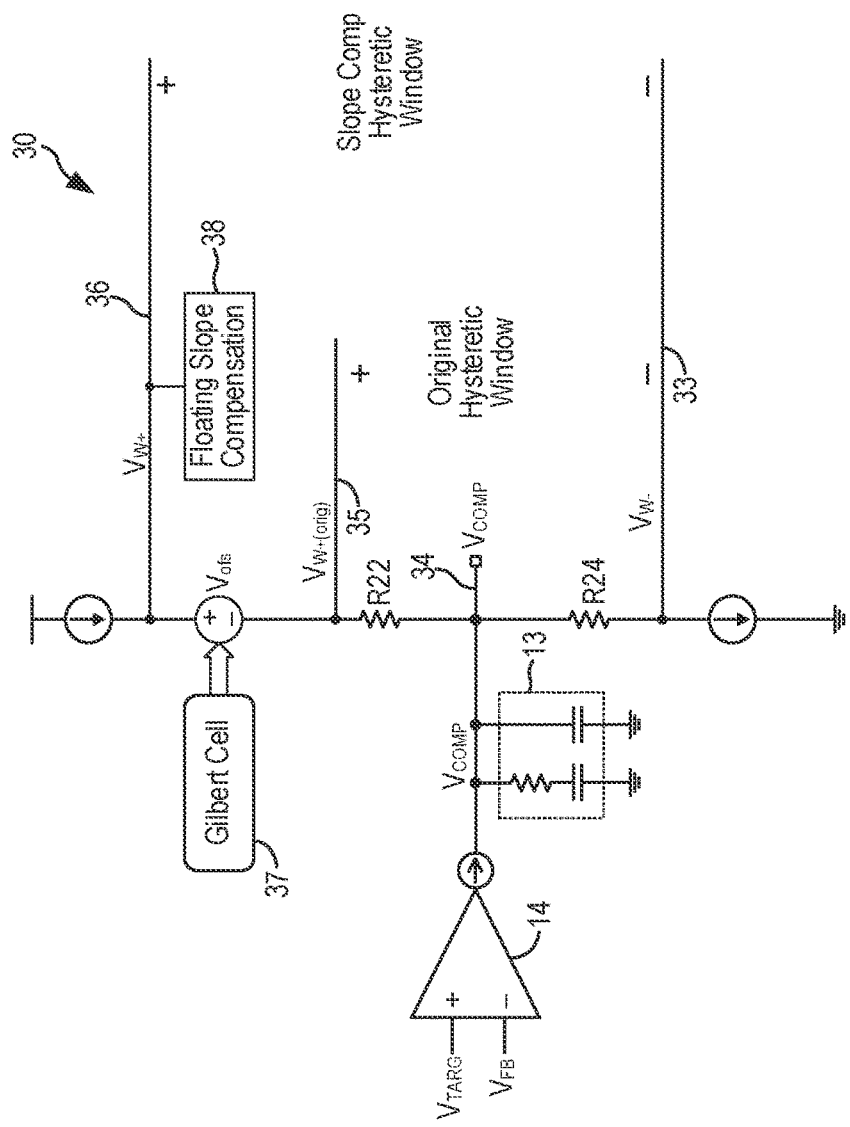
FIG. 3 is a schematic diagram illustrating a conventional slope compensation technique in some examples.

Conventional methods for providing slope compensation in a peak current mode control modulator typically involve using complex circuits such as Gilbert cell translinear circuit and electrically floating slope compensation circuit. The conventional slope compensation techniques tend to be complex and difficult to implement. FIG. 3 is a schematic diagram illustrating a conventional slope compensation technique in some examples. Referring to FIG. 3, the error amplifier 14 generates the error signal $V_{COMP}$ (node 34) indicative of the difference between the feedback voltage $V_{FB}$ and the target voltage $V_{TARG}$. A voltage window $V_{w+}$ (node 35) and $V_{w-}$ (node 33) is formed around the error signal $V_{COMP}$ and tracks with the changes in the error signal. To introduce slope compensation, a Gilbert cell translinear circuit 37 is used to generate an offset voltage Vofs to shift the window voltage $V_{w+}$ (node 35) to an offset window voltage $V_{w+}$ (node 36). A floating slope compensation circuit 38 is provided which generates a ramp signal referenced off the offset window voltage $V_{w+}$ (node 36).

Figure 4:
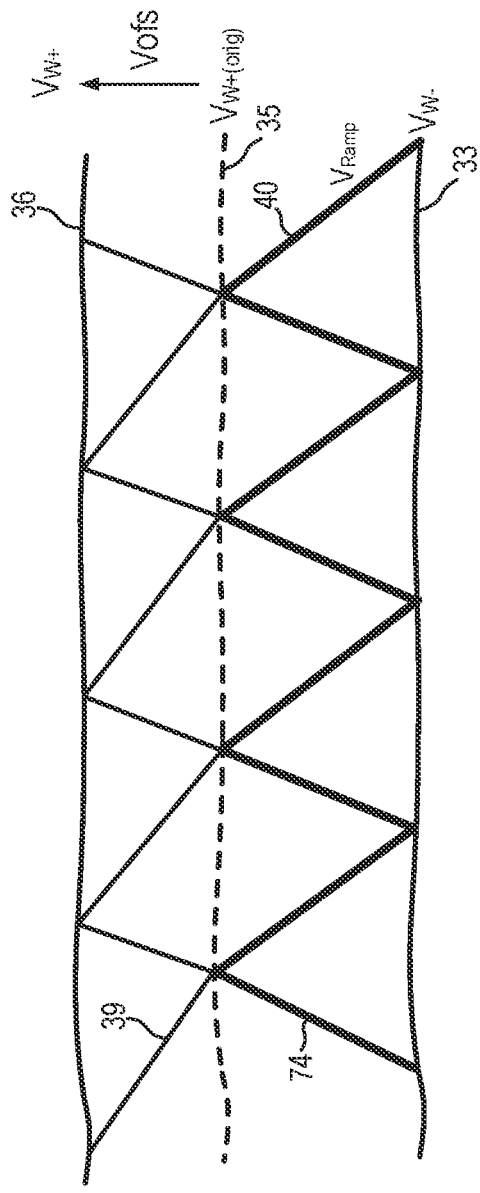
FIG. 4 illustrates the ramp signal and the slope compensation signal in the conventional slope compensation technique shown in FIG. 3 in some examples.

FIG. 4 illustrates the ramp signal and the slope compensation signal in the conventional slope compensation technique shown in FIG. 3 in some examples. Referring to FIG.

Figure 5:
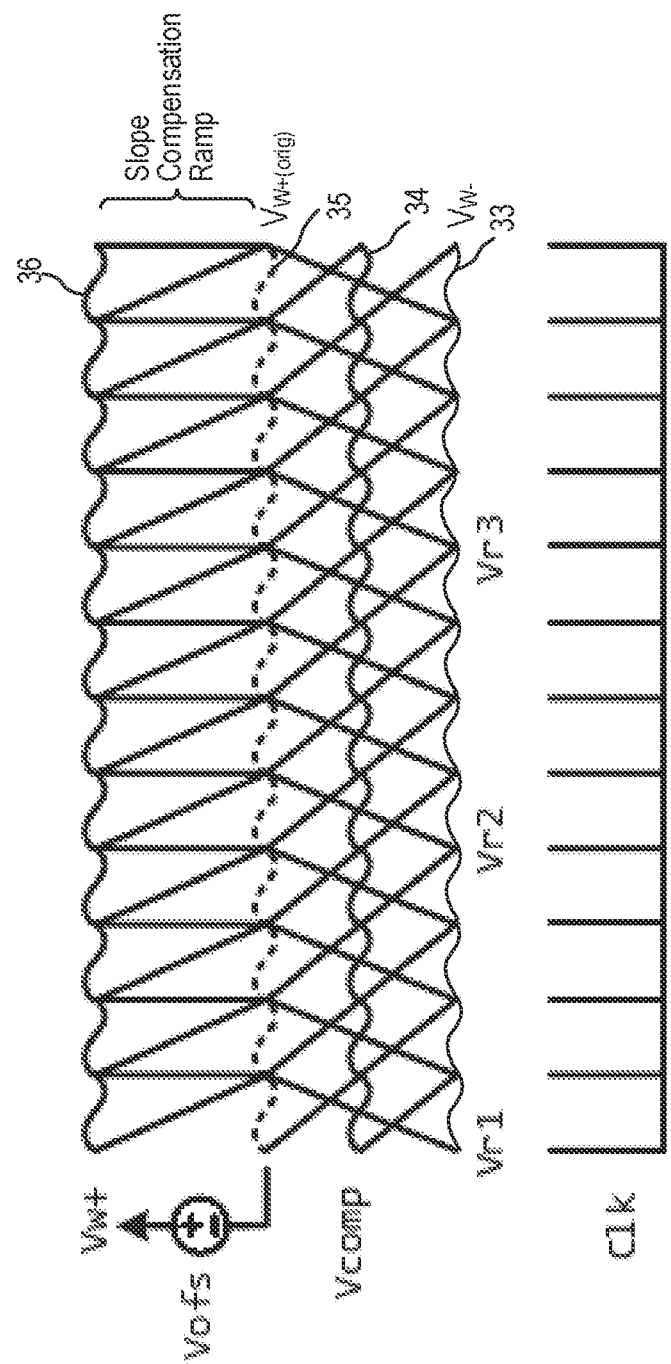
FIG. 5 illustrates the ramp signal and the slope compensation signal in the conventional slope compensation technique for a three phase modulator in some examples.

4, the modulator generates the synthesized ramp signal $V_{RAMP}$ 40 replicating the expected inductor current waveform. The synthesized ramp signal varies between the original hysteretic window of $V_{w-}$ (node 33) and $V_{w+}$ (node 35). The slope compensation signal 39 is added to the synthesized ramp signal to provide the proper amount of slope compensation. FIG. 5 illustrates the ramp signal and the slope compensation signal in the conventional slope compensation technique for a three phase modulator in some examples. Referring to FIG. 5, in the case the modulator is operated in three phases, three ramps signals Vr1, Vr2 and Vr3 are generated and slope compensation ramps are generated to intersect with each ramp signal of each phase. The conventional slope compensation techniques use complex translinear circuits and use floating slope compensation circuit which are undesirable.

In embodiments of the present invention, a ramp signal generator for a peak current mode modulator generates a synthesized current loop signal with slope compensation integrated therein. In some embodiments, the synthesized current loop signal is a ramp signal. In some embodiments, the ramp signal is a voltage signal indicative of the current loop signal. In this manner, slope compensation can be provided using a robust and simple circuit implementation.

Figure 6:
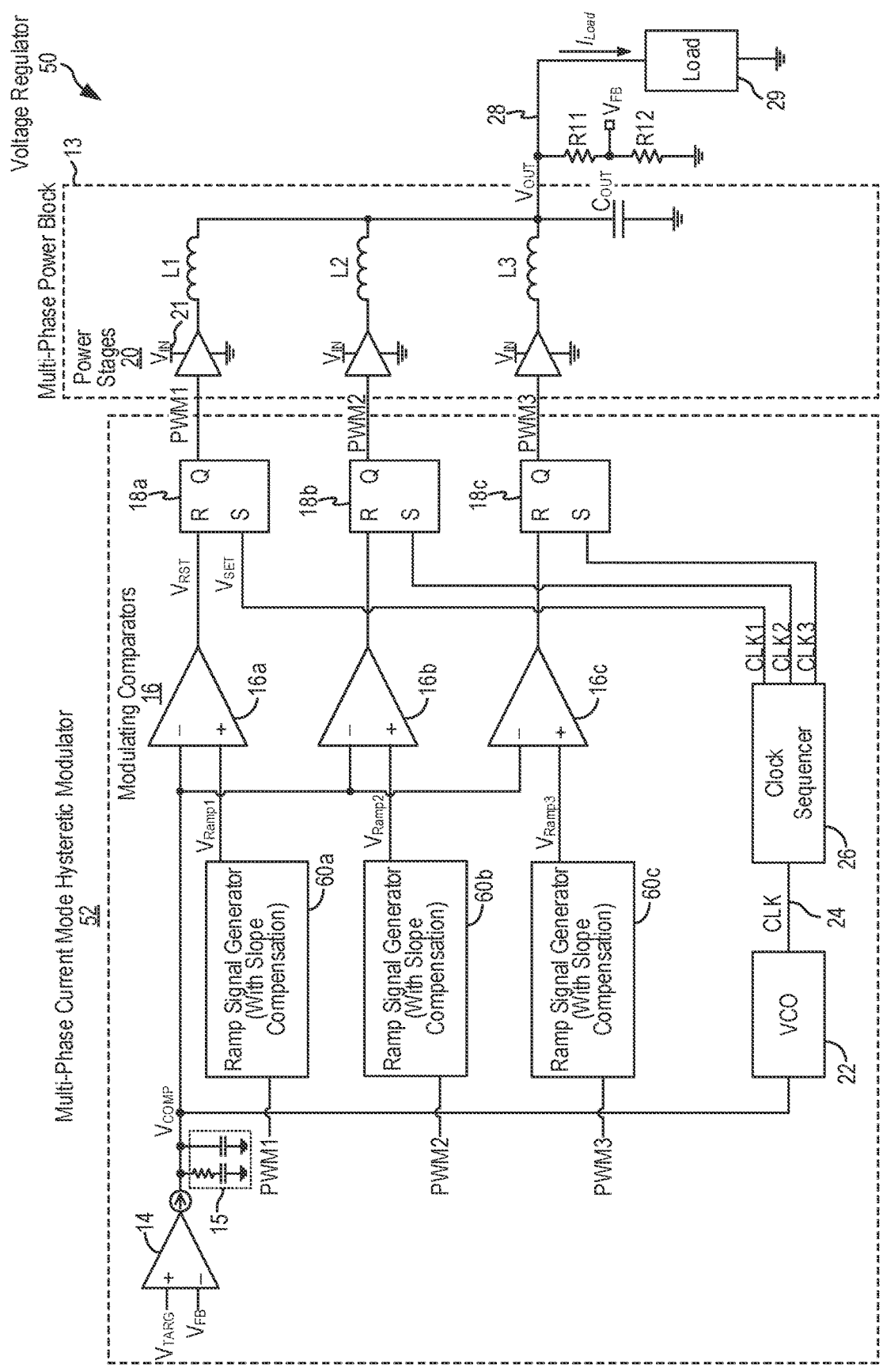
FIG. 6 is a schematic diagram of a voltage regulator incorporating a multi-phase current mode hysteretic modulator in some embodiments.

FIG. 6 is a schematic diagram of a voltage regulator incorporating a multi-phase current mode hysteretic modulator in some embodiments. Like elements in FIGS. 1 and 6 are given like reference numerals to simplify the discussion. Referring to FIG. 6, a voltage regulator 50 includes a multi-phase current mode hysteretic modulator 52 ("modulator 52") coupled to drive a multi-phase power block 13. In the present embodiment, the multi-phase modulator 52 includes three phases and the power block 13 includes three power stages 20 with associated output inductors L1 to L3 and an output capacitor $C_{OUT}$.

The multi-phase current mode hysteretic modulator 52 includes an error amplifier 14 receiving the feedback voltage $V_{FB}$ and the target voltage $V_{TARG}$ to generate an error signal $V_{COMP}$. The error signal $V_{COMP}$ is coupled to a voltage-controlled oscillator (VCO) 22 to generate the clock signal CLK (node 24) which is divided into three clock phases CLK1, CLK2 and CLK3 by the clock sequencer 26. The clock signals CLK1-CLK3 are coupled to a set of latch circuits 18a-c as the set signals $V_{SET}$. The error signal $V_{COMP}$ is also coupled to the inverting input terminals of a set of modulating comparators 16a-c. The modulating comparators 16a-c generate the reset signals $V_{RST}$ for the latch circuits 18a-c. In the present example, the latch circuits 18a-c are each a set-reset flip-flop circuit.

In embodiments of the present disclosure, the current mode hysteretic modulator 52 implements a voltage control loop through the feedback voltage $V_{FB}$ and a current control loop using a synthesized current loop signal generated in the modulator 52. No sensed inductor current is needed to implement the current control loop. According to embodiments of the present disclosure, the current mode hysteretic modulator 52 incorporates a ramp signal generator 60 to generate a ramp signal as the current loop signal indicative of the expected inductor current waveform for the current control loop. Furthermore, the ramp signal generator 60 generates the ramp signal with slope compensation incorporated therein so that separate slope compensation circuit is not needed. In the multi-phase modulator 52, separate ramp signal generators 60a-c are provided for each phase of the control loop. In particular, the ramp signal generator 60n receives the respective pulse-width modulation signal PWMn and generates a ramp signal $V_{RAMPn}$ which is provided to the respective modulating comparator 16n to form the current control loop.

The use of a multi-phase modulator 52 is illustrative only and not intended to be limiting. In other embodiments, a modulator incorporating the ramp signal generator of the present disclosure can be implemented as a single phase current mode hysteretic modulator driving a single phase power block. Alternately, the modulator incorporating the ramp signal generator of the present disclosure can be implemented as a multi-phase current mode hysteretic modulator driving two or more power blocks in corresponding clock phases. The exact implementation of the peak current mode hysteretic modulator is not critical to the practice of the present invention.

Moreover, in embodiments of the present disclosure, the current mode hysteretic modulator 52 can be configured as a buck modulator for stepping down the input voltage or a boost modulator for stepping up the input voltage, or a buck-boost modulator implementing both step-up and step-down functions. Furthermore, in embodiments of the present disclosure, the current mode hysteretic modulator can be configured for peak current mode control or valley current mode control.

Figure 7:
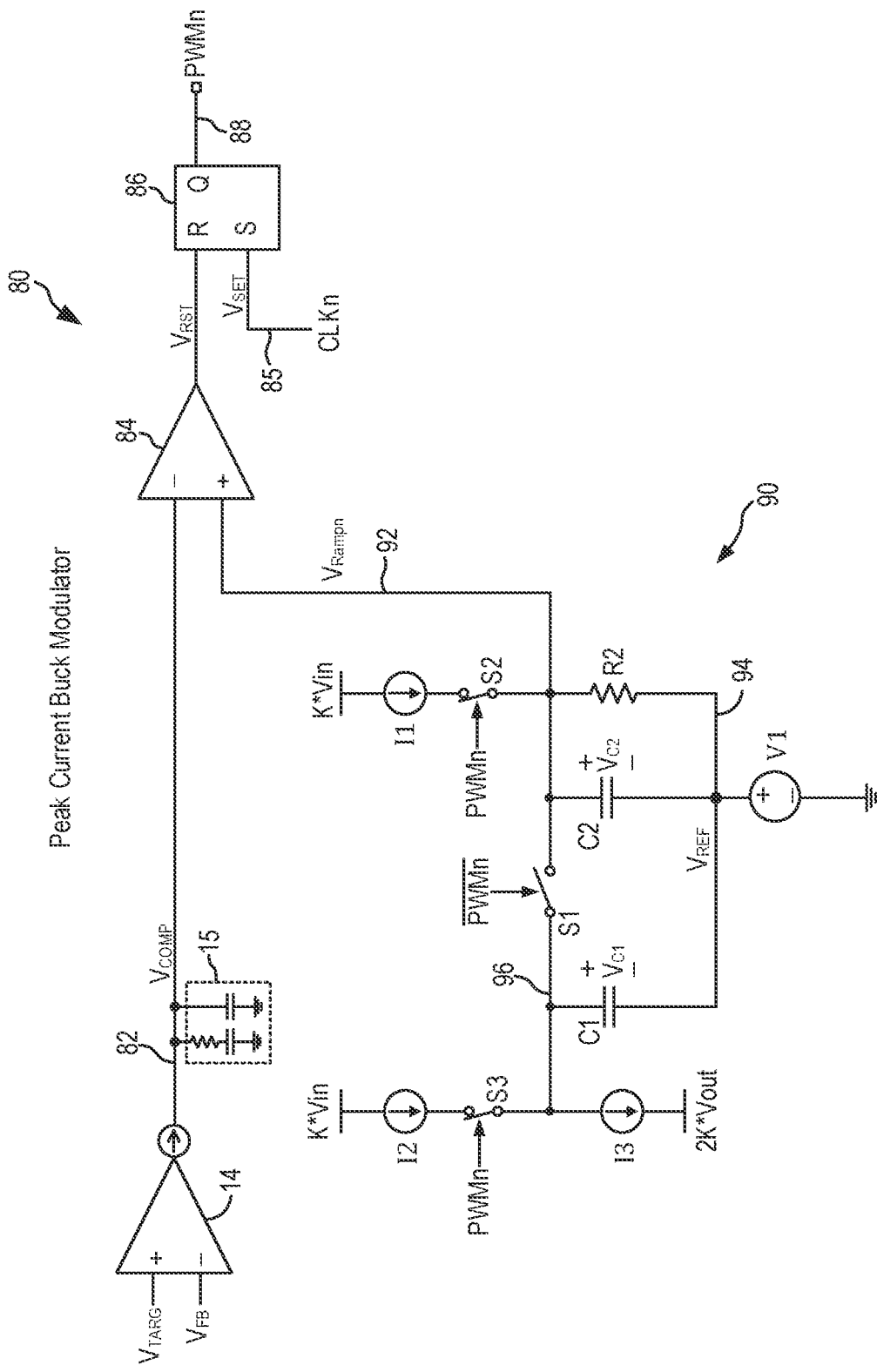
FIG. 7 is a schematic diagram of a ramp signal generator with slope compensation incorporated in a peak current mode buck modulator in embodiments of the present invention.

FIG. 7 is a schematic diagram of a ramp signal generator with slope compensation incorporated in a peak current mode buck modulator in embodiments of the present invention. Referring to FIG. 7, a ramp signal generator 90 is incorporated into a current mode control hysteretic modulator 80. In embodiments of the present disclosure, the current mode control hysteretic modulator 80 refers to a modulator incorporating a current control loop, usually in conjunction with a voltage control loop. In present embodiments, the current mode control hysteretic modulator is a peak current mode hysteretic buck modulator, also referred to as a peak current mode buck modulator in the present description. A peak current mode modulator controls the duty cycle of the power switches in response to the peak of the current loop signal which is indicative of the expected inductor current waveform for the current control loop. Furthermore, in the present embodiments, the peak current mode modulator 80 uses a synthesized current loop signal for the current control loop and does not require a sensed inductor current signal to be fed back to the modulator.

In particular, the modulator 80 includes an error amplifier 14 receiving the feedback voltage $V_{FB}$ and the target voltage $V_{TARG}$ to generate an error signal $V_{COMP}$ on a node 82. In one example, the error amplifier 14 is a transconductance amplifier and generates an output current signal which is converted to a voltage signal by loop filter 15 coupled to the output node 82. The error signal $V_{COMP}$ on node 82 is therefore a voltage signal in the present example. The error signal $V_{COMP}$ is coupled to the inverting input terminal of a modulating comparator 84. The ramp signal generator 90 generates a ramp signal $V_{RAMP}$ (node 92) which is provided to the non-inverting input terminal of the modulating comparator 84. The modulating comparator 84 generates the reset signal $V_{RST}$ which is coupled to the Reset input terminal of a latch circuit 86. The latch circuit 86 receives a clock signal CLK, generated by a voltage-controlled oscillator (not shown) in response to the error signal $V_{COMP}$, as the set signal $V_{SET}$ which is coupled to the Set input terminal of the latch circuit 86. In one example, the latch circuit 86 is a flip-flop circuit. The latch circuit 86 generates a pulse-width modulation signal PWM on an output node 88. In the case the modulator 80 is a multi-phase modulator, the schematic diagram in FIG. 7 is representative of a single phase n of the modulator 80. The modulating comparator 84 receives a ramp signal $V_{RAMPn}$ and generates the reset signal for the latch circuit 86. The latch circuit 86 also receives the clock signal CLKn as the set signal. The latch circuit 86 generates a pulse-width modulation signal PWMn on the output node 88 for the phase n of the multi-phase modulator.

In embodiments of the present disclosure, the ramp signal generator 90 generates the ramp signal $V_{RAMP}$ (node 92) using a switched capacitor circuit. The ramp signal $V_{RAMP}$ thus generated contains information about the expected inductor current waveform, when combined with the voltage at node 92, and also incorporates slope compensation. Accordingly, the ramp signal generator 90 has incorporated therein slope compensation while generating the ramp signal as the current loop signal. No additional slope compensation circuit is needed.

The ramp signal generator 90 includes a capacitor C1 coupled between a node 96 and a node 94 and a capacitor C2 coupled between the node 92 and the node 94. The node 94 is biased to a reference voltage $V_{REF}$, such as through a voltage source V1. A switch S1 is coupled between the capacitors C1 and C2 (that is, between nodes 96 and 92) to form the switched capacitor circuit. The switch S1 is controlled by a signal indicative of the pulse-width modulation signal PWM. In particular, the switch S1 is controlled by the inverse of the pulse-width modulation signal PWM so that the switch S1 is open in response to the on-duration of the pulse-width modulation signal PWM and the switch S1 is closed in response to the off-duration of the pulse-width modulation signal PWM.

The ramp signal generator 90 includes a first current source I1 providing a current proportional to the input voltage $V_{IN}$. In one embodiment, the first current source I1 provides a current proportional to K times the input voltage $V_{IN}$, K being a number greater than 0. The first current source I1 is connected to node 92 through a switch S2 controlled by the pulse-width modulation signal PWM to provide current to node 92 during the on-duration of the PWM signal. The ramp signal generator 90 further includes a second current source I2 providing a current proportional to the input voltage $V_{IN}$ and a first current sink I3 providing a current proportional to two times the output voltage $V_{OUT}$. In one embodiment, the second current source I2 provides a current proportional to K times the input voltage $V_{IN}$ and the first current sink I3 provides a current proportional to 2K times the output voltage $V_{OUT}$. The second current source I2 is connected to node 96 through a switch S3 controlled by the pulse-width modulation signal PWM to provide current to node 96 during the on-duration of the PWM signal. Meanwhile, the first current sink I3 is directly connected to node 96 to sink a current from node 96.

In some embodiments, the ramp signal generator 90 further includes a resistor R2 coupled between the node 92 and the node 94, that is, in parallel with the capacitor C2. The resistor R2 removes the DC component of the ramp signal at node 92, leaving only the AC component (or the triangular ripple) of the ramp signal where the AC component tracks the up-ramp and down-ramp of the inductor current waveform. The resistor R2 is optional and may be omitted in other embodiments of the present disclosure. The use of resistor R2 improve DC biasing and transient performance.

In some embodiments, capacitor C1 and capacitor C2 have the same capacitance values. In other embodiments, the capacitors C1 and C2 can have different capacitance values to adjust the amount of slope compensation being provided, as described in more details below.

In operation, the ramp signal generator 90 generates a slope compensated ramp signal $V_{RAMP}$ using the switched capacitor circuit of capacitors C1, C2 and the switch S1. The ramp signal $V_{RAMP}$ has an up-ramp portion when the ramp signal ramps up or increases. The ramp signal $V_{RAMP}$ has a down-ramp portion when the ramp signal ramps down or decreases. In the present embodiment, for the peak current mode buck modulator 80, the ramp signal generator 90 generates the ramp signal $V_{RAMP}$ by splitting or dividing the charge of the expected current mode signal in the up-ramp portion across the two capacitors C1 and C2 and sharing the charge between the two capacitors C1 and C2 in the down-ramp portion.

More specifically, optimal slope compensation is achieved when the slope compensation ramp rate equals that ramp rate of the current mode signal (the inductor current waveform to be replicated). For instance, for the peak current mode buck modulator, the current mode signal has a down ramp rate or down slope of $-gm*V_{OUT}/C$. To achieve optimal slope compensation control, the slope for the down-ramp of the ramp signal should be set to $-gm*V_{OUT}/C$.

In embodiments of the present embodiment, the ramp signal generator 90 generates the ramp signal with optimal slope compensation by subtracting out a given amount of signal during the PWM on-duration and then during the PWM-off curation, the ramp signal generator 90 ensures the ramp signal returns to the desired position having the desired slope.

To replicate the inductor current waveform in a peak current mode operation in a buck converter, the ramp signal, without slope compensation, should have a current upslope (or up-ramp) being proportional to $(V_{IN}-V_{OUT})$ during the PWM on-duration and a current downslope (or down-ramp) being proportional to $-V_{OUT}$ during the PWM off-duration. That is, the ramp signal, without slope compensation, should matches the ramp rates of the current mode signal (the inductor current waveform).

In the peak current mode buck modulator of the present disclosure, the ramp signal generator implements slope compensation by matching the ramp signal downslope to the current downslope of the current mode signal during the PWM off-duration. As thus configured, the PWM on-duration is shortened by an amount equal to the case if the $V_{OUT}$ term were removed from the ramp upslope. Accordingly, to introduce slope compensation to the ramp signal, the ramp signal upslope is made proportional to $V_{IN}$, instead of having the ramp signal upslope being proportional to $(V_{IN}-V_{OUT})$, as in the case without slope compensation.

The ramp signal generator 90 realizes ramp signal generation and slope compensation by using the switched capacitor circuit to divide the charge associated with the current mode signal during the up-ramp among the two capacitors and to share the charge associated with the current mode signal during the down-ramp, while conserving the total charge over a given switching cycle. As thus configured, capacitor C2 provides the ramp signal up-ramp and the capacitors C1 and C2 in parallel provide the ramp signal down-ramp. During the PWM on-duration with switch S1 being open and switches S2 and S3 being closed, the capacitor C2 is charged by a current with the $V_{OUT}$ term removed. That is, the capacitor C2 is charged by a current proportional to $K*V_{IN}$ during the PWM on-duration. With the switch S1 open, the ramp signal $V_{RAMP}$ (node 92) is the voltage $V_{C2}$ across the capacitor C2. In this manner, the ramp signal $V_{RAMP}$ (node 92) has an up-ramp incorporating slope compensation. The ramp signal $V_{RAMP}$ ramps up during the PWM on-duration to provide an up-ramp with slope compensation to the modulating comparator 84.

Also during the PWM on-duration, the capacitor C1 accumulates the missing charge that would be put on capacitor C2 when slope compensation is not implemented. In particular, the capacitor C1 is being charged by the second current source I2 (through switch S3) and the first current sink I3 to a voltage proportional to $K^*V_{IN}-2K^*V_{OUT}$. The voltage $V_{C1}$ on capacitor C1 ramps up to store the charge not included on capacitor C2 while switch S1 is open.

Under the peak current control scheme, when the ramp signal $V_{RAMP}$ reaches the error signal $V_{COMP}$ (node 82), the modulating comparator 84 is triggered and the PWM signal is reset. The PWM on-duration ends and the PWM off-duration begins. Accordingly, switch S1 is closed and switches S2 and S3 are open. As a result, capacitors C1 and C2 are connected in parallel and are disconnected from the current sources I1 or I2. That is, nodes 92 and 96 are shorted together. The charge accumulated on capacitors C1 and C2 is shared and the ramp signal $V_{RAMP}$ becomes the average of the capacitor voltages $V_{C1}$ and $V_{C2}$. As a result of the charge sharing, the ramp signal $V_{RAMP}$ begins the down-ramp at the point where it should be if there was no slope compensation. That is, the ramp signal down-ramp has a slope of $-K^*V_{OUT}$. In ramp signal generator 90, the effective capacitance is doubled by using capacitors C1 and C2 in parallel, but the first current sink I3 provides a current proportional to two times the output voltage $V_{OUT}$ and the ramp rates are therefore maintained. The ramp signal $V_{RAMP}$ ramps down until the next switching cycle is commanded by the clock signal CLK.

FIG. 8, which includes FIGS. 8(a) and 8(b), illustrates the ramp signal generated by the ramp signal generator of FIG. 7 in some examples. In particular, FIG. 8 illustrates the ramp signal generated for a peak current mode control modulator. Referring to FIG. 8(a), curve 112 (dot-dash line) depicts the ideal current mode signal without slope compensation. During the PWM on-duration, the slope compensated ramp signal $V_{RAMP}$ ramps up (curve 104) as a function of the voltage on capacitor C2 ($V_{C2}$). Meanwhile, the voltage on capacitor C1 ($V_{C1}$) also ramps up (curve 106) to store the charge that was not included on capacitor C2. The voltage ramp $V_{C2}$ diverges from the voltage ramp $V_{C1}$ on the up-ramp as the two capacitors are being charged with different current values. In particular, the voltage ramp $V_{C2}$ ramps up faster than the voltage ramp $V_{C1}$.

When the ramp signal reaches the error signal $V_{COMP}$ and the PWM on-duration terminates, the voltage $V_{C2}$ on capacitor C2 and the voltage $V_{C1}$ on capacitor C1 are shorted together and charge sharing occurs between the two capacitors. The voltage ramps $V_{C1}$ and $V_{C2}$ converge and the down-ramp of the ramp signal $V_{RAMP}$ (curve 108) begins at the optimal point and having the desired slope (proportional to $-K^*V_{OUT}$). In particular, the ramp signal $V_{RAMP}$ down-ramp matches the ideal current mode signal down-ramp to realize optimal slope compensation. In this manner, the ramp signal $V_{RAMP}$ with slope compensation is generated. FIG. 8(b) illustrates the ramp signal $V_{RAMP}$ over several switching cycles of the modulator operation.

Figure 9:
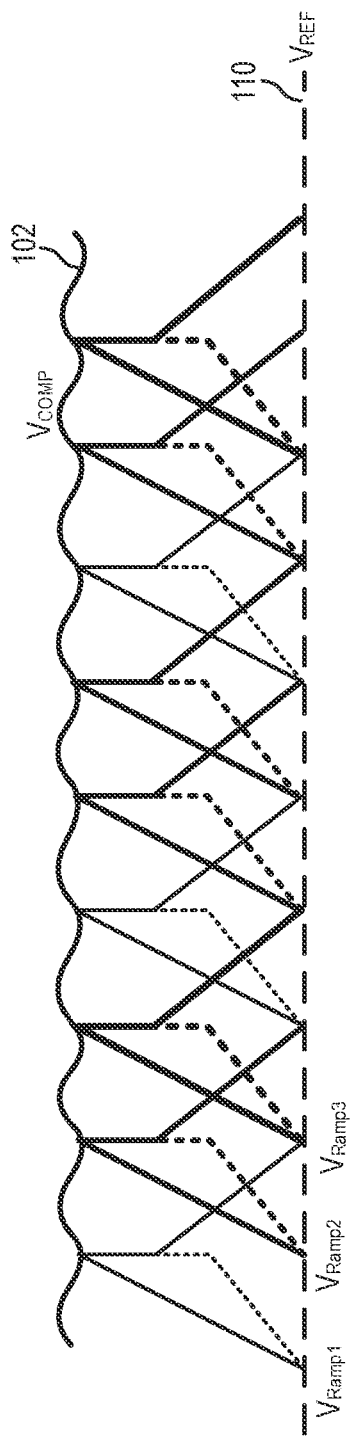
FIG. 9 illustrates three-phase ramp signals which can be generated using the ramp signal generator of FIG. 7 in some examples.

FIG. 9 illustrates three-phase ramp signals which can be generated using the ramp signal generator of FIG. 7 in some examples. In the example shown in FIG. 9, the ramp signal generator is applied in a multi-phase modulator. Accordingly, the ramp signal generator of FIG. 7 can be configured to generate multi-phase ramp signals $V_{RAMP1}$, $V_{RAMP2}$, and $V_{RAMP3}$, using respective PWM signals of the corresponding clock phase.

The ramp signal generator of the present disclosure realizes many advantages over conventional circuits and techniques. First, the ramp signal generator of the present invention realizes simplicity of design, using only a switched capacitor circuit and current sources. The circuit architecture of the ramp signal generator is largely process agnostic. Second, the slope compensation signal generation is incorporated into the ramp signal generator so that a separate slope compensation signal generation circuit is not needed. Furthermore, no complex translinear circuit or floating circuit is used in ramp signal generator of the present disclosure. Lastly, the ramp signal generator provides flexibility to modify the slope compensation provided to the ramp signal and implementation is realized with only a single switch.

Returning to FIG. 7, the ramp signal generator circuit 90 using a switched capacitor circuit provides flexibility to adjust the amount of slope compensation to be applied. In the embodiments described above, the capacitors C1 and C2 have the same capacitance value. In other embodiments, the ratio of the capacitance of capacitors C1 and C2 can be set to a value other than 1 to change the amount of slope compensation applied. That is, the capacitance values of capacitor C1 and C2 can be equal or unequal to each other.

Furthermore, in other embodiments, current sources I1 and I2 can be biased to different ratios of the input voltage $V_{IN}$ to adjust the slope compensation ramp rate, as long as the sum of the current sources I1 and I2's K-factor is the same as current sink I3's K-factor. For example, the current source I1 can be set to be proportional to $0.1K^*V_{IN}$ while the current source I2 can be set to be proportional to $1.9K^*V_{IN}$. The sum of current sources I1/I2's K-factor is 2 which is equal to the current sink I3's K-factor of 2.

Alternately, both the capacitance values of capacitors C1 and C2 and the current values of the current sources I1 and I2 can be varied to obtain the desired slope compensation. In the above described embodiments, the capacitance values of capacitors C1 and C2 are the same (C1=C2) and the capacitor ratio of capacitors C1 and C2 is 1. Also, the current values for current sources I1 and I2 are the same, that is, I1=I2. In alternate embodiments, capacitance values can be selected as C2=N*C1 and the current source value can be set to I1=N*I2, and the K-factor can be set to $K^*(I1+I2)=K^*V_{OUT}$, where N is a positive number greater than 0. As thus configured, the ramp signal generator operates identically to the configuration of C1=C2 and I1=I2.

In the above-described embodiments, the ramp signal generator is applied in a peak current mode hysteretic modulator configured as a buck modulator for stepping down the input voltage $V_{IN}$ to the output voltage $V_{OUT}$ having a lower voltage value. In other embodiments, the ramp signal generator is applied in a peak current mode boost modulator or a peak current mode buck-boost modulator. A boost modulator is applied to step up an input voltage $V_{IN}$ to an output voltage $V_{OUT}$ having increased voltage value. A buck-boost modulator provides both step-up and step-down functions.

Figure 10:
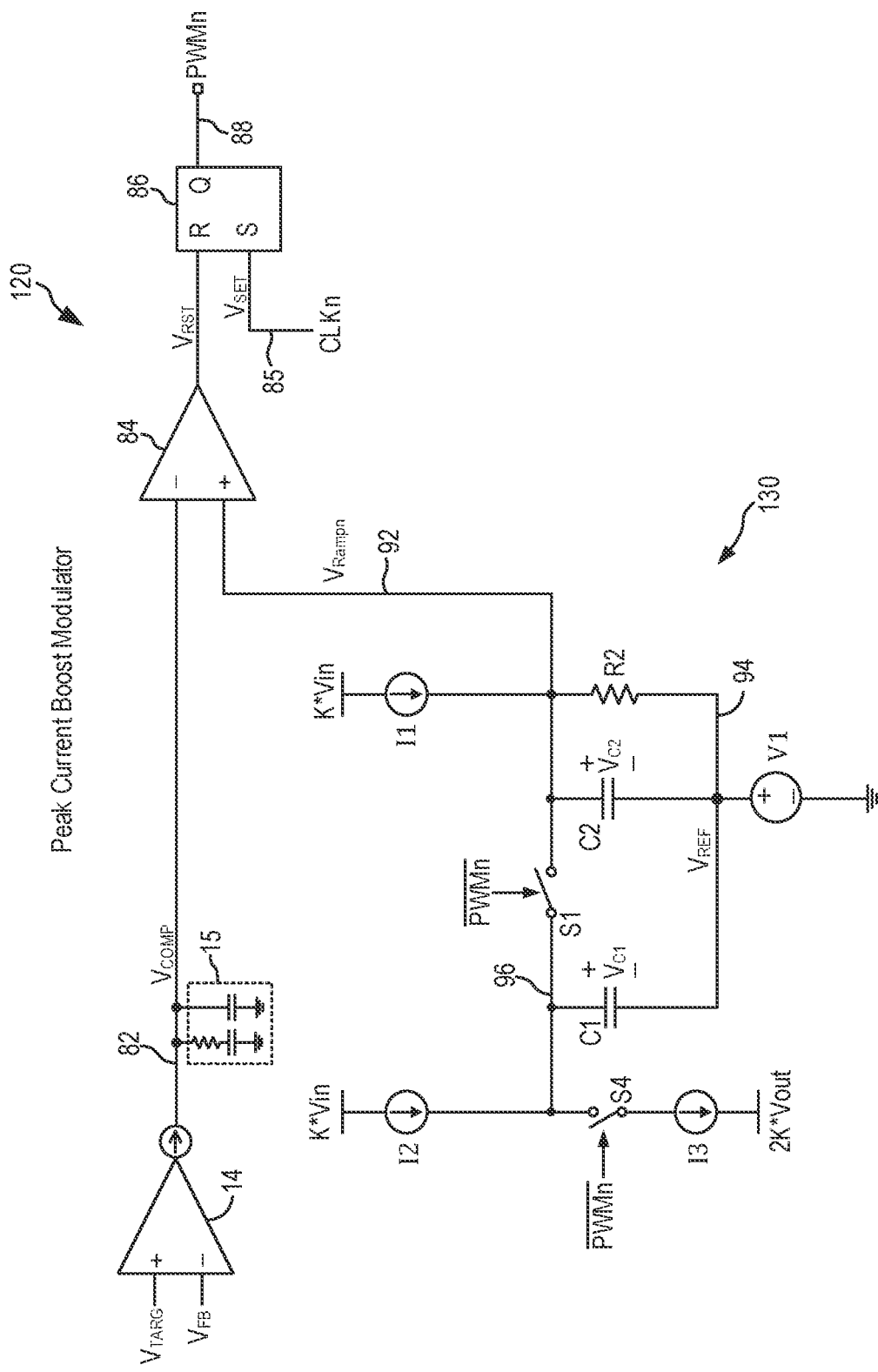
FIG. 10 is a schematic diagram of a ramp signal generator with slope compensation incorporated in a peak current mode boost modulator in alternate embodiments of the present invention.

FIG. 10 is a schematic diagram of a ramp signal generator with slope compensation incorporated in a peak current mode boost modulator in alternate embodiments of the present invention. In particular, a ramp signal generator 130 in FIG. 10 is configured in a peak current mode boost modulator 120 to be applied in a boost switching regulator for stepping up the input voltage $V_{IN}$ to an output voltage $V_{OUT}$ having increased voltage value. Referring to FIG. 10, the ramp signal generator 130 is incorporated into the peak current mode boost modulator 120 in substantially the same manner as the peak current mode buck modulator 80 of FIG. 7. Like elements in FIGS. 7 and 10 are given like reference numerals and description will not be repeated.

The ramp signal generator 130 includes a switched capacitor circuit formed by capacitors C1 and C2 and switch S1 to generate a ramp signal with built-in slope compensation. The ramp signal generator 130 realizes ramp signal generation and slope compensation by using the switched capacitor circuit to divide the charge associated with the current mode signal during the up-ramp among the two capacitors and to share the charge associated with the current mode signal during the down-ramp, while conserving the total charge over a given switching cycle. As thus configured, capacitor C2 provides the ramp signal up-ramp and the capacitors C1 and C2 in parallel provide the ramp signal down-ramp.

The ramp signal generator 130 includes the capacitor C1 coupled between the node 96 and the node 94 and the capacitor C2 coupled between the node 92 and the node 94. The node 94 is biased to a reference voltage $V_{REF}$, such as through a voltage source V1. The ramp signal generator 130 includes a first current source I1 providing a current proportional to the input voltage $V_{IN}$ or K*Vin, K being a number greater than zero. The first current source I1 is directly connected to node 92 to provide current to node 92. A resistor R2 is coupled in parallel with capacitor C2 to remove the DC component of the ramp signal at node 92, as described above. The switch S1 is controlled by a signal indicative of the pulse-width modulation signal PWM. In particular, the switch S1 is controlled by the inverse of the pulse-width modulation signal PWM so that the switch S1 is open in response to the on-duration of the pulse-width modulation signal PWM and the switch S1 is closed in response to the off-duration of the pulse-width modulation signal PWM.

The ramp signal generator 130 includes a second current source I2 providing a current proportional to the input voltage $V_{IN}$ (or K*Vin) and a first current sink I3 providing a current proportional to two times the output voltage $V_{OUT}$ (or 2K*Vout). The second current source I2 is directly connected to node 96 to supply current to node 96. Meanwhile, the first current sink I3 is connected to node 96 through a switch S4 controlled by the inverse of the pulse-width modulation signal PWM to sink current from node 96 during the off-duration of the PWM signal.

In some embodiments, the ramp signal generator 130 is constructed using capacitors C1 and C2 having unequal capacitance values to allow the equal charge to develop unequal voltages on nodes 92 and 96 to realize slope compensation. That is, in some embodiments, the capacitance ratio of capacitors C1/C2 is not 1. In the present description, the rate of change of the capacitor voltages at nodes 92 and 96 is controlled asymmetrically between the two capacitors meaning the two capacitors C1 and C2 have different ramp rates. Alternately, the ramp signal generator 130 is constructed using first current source I1 and second current source I2 having unequal current values to divide the charge during the up-ramp asymmetrically to realize slope compensation. That is, in some embodiments, the current ratio of current sources I1/I2 is not 1. In practice, either the capacitor ratio can be varied or the current source ratio can be varied to introduce the asymmetric difference in the rate of change of the capacitor voltages for realizing the slope compensation. Furthermore, in some embodiments, the capacitor ratio C1/C2 and the current source ratio I1/I2 can have related asymmetric values. For example, capacitor C1 may be different from capacitor C2 by a given ratio while current I1 is different from current I2 by the same ratio.

In operation, during the PWM on-duration, switches S1 and S4 are open and the capacitor C2 is charged by a current proportional to $K*V_{IN}$ (with the Vout term removed). With the switch S1 open, the ramp signal $V_{RAMP}$ (node 92) is the voltage $V_{C2}$ across the capacitor C2. In this manner, the ramp signal $V_{RAMP}$ (node 92) has an up-ramp incorporating slope compensation. The ramp signal $V_{RAMP}$ ramps up during the PWM on-duration to provide an up-ramp with slope compensation to the modulating comparator 84.

Also during the PWM on-duration, the capacitor C1 accumulates the missing charge that would be put on the combined capacitor C1+C2 when slope compensation is not implemented. In particular, the capacitor C1 is being charged by the second current source I2 to a voltage proportional to $K*V_{IN}$. The voltage $V_{C1}$ on capacitor C1 ramps up to store the charge not included on capacitor C2 while switch S1 is open. With the capacitors C1 and C2 having unequal capacitance values, or current sources I1 and I2 having unequal current values, the ramp rate for voltage $V_{C2}$ is different from the ramp rate for voltage $V_{C1}$. Thus, the up-ramp for capacitor C2 diverges from the up-ramp for capacitor C1. As a result, different voltages are developed on capacitors C1 and C2; however, the total charge is conserved over the switching cycle.

Under the peak current control scheme, when the ramp signal $V_{RAMP}$ reaches the error signal $V_{COMP}$ (node 82), the modulating comparator 84 is triggered and the PWM signal is reset. The PWM on-duration ends and the PWM off-duration begins. Accordingly, switches S1 and S4 are closed. As a result, capacitors C1 and C2 are connected in parallel and are connected to the current sources I1 or I2 as well as the current sink I3. That is, nodes 92 and 96 are shorted together. The charge accumulated on capacitors C1 and C2 is shared and the ramp signal $V_{RAMP}$ becomes the average of the capacitor voltages $V_{C1}$ and $V_{C2}$. As a result of the charge sharing, the ramp signal $V_{RAMP}$ begins the down-ramp at the point where it should be if there was no slope compensation. That is, the ramp signal down-ramp has a slope of $-K*(V_{IN}-V_{OUT})$. In ramp signal generator 130, the effective capacitance is doubled by using capacitors C1 and C2 in parallel, but the first current sink I3 provides a current proportional to two times the output voltage $V_{OUT}$. Therefore, the ramp rates are maintained at $-(Vin-Vout)$. The ramp signal $V_{RAMP}$ ramps down until the next switching cycle is commanded by the clock signal CLK.

Accordingly, the ramp signal generator 130 is configured for a peak current mode boost modulator by dividing the charge fed to the capacitors C1 and C2 during the up-ramp, or dividing the capacitance so that the voltages diverge, and connecting capacitors C1 and C2 during the down-ramp, while conserving the total charge over a given switching cycle to be independent of the dividing function. In this way, the ramp signal is generated with slope compensation built-in. In the case of the peak current mode boost modulator, the ramp signal generator 130 realizes voltage ramp divergence on the up-ramp by using unequal capacitor ratio (C1/C21≠1) or unequal current source ratio (I1/I2≠1).

In the above-described embodiments, the ramp signal generator is applied in a peak current mode hysteretic modulator, in either buck or boost configuration. In embodiments of the present disclosure, the ramp signal generator can be applied in a valley current mode hysteretic modulator, in either buck or boost configuration.

As described above, peak current mode control monitors the up-ramps of the inductor current during the on-duration or the charge phase of the PWM signal. When the inductor current exceeds the error signal $V_{COMP}$, the modulating comparator (such as comparator 84 in FIG. 7) asserts its output which resets the latch circuit (such as latch circuit 86 in FIG. 7) to terminate the charge phase or the on-duration of the PWM signal and initiate the discharge phase or the off-duration of the PWM signal. The discharge phase or the off-duration continues until the next clock pulse sets the latch circuit and initiates the next charge phase or on-duration of the next switching cycle.

Valley current mode control monitors the down-ramps of the inductor current during the off-duration or the discharge phase of the PWM signal. When the inductor current falls below the error signal $V_{COMP}$, the modulating comparator asserts its output which sets the latch circuit to terminate the discharge phase and to initiate the charge phase or on-duration of a new switching cycle. The charge phase or the on-duration continues until the next clock pulse resets the latch circuit and initiates the next discharge phase or off-duration of the switching cycle.

Figure 11:
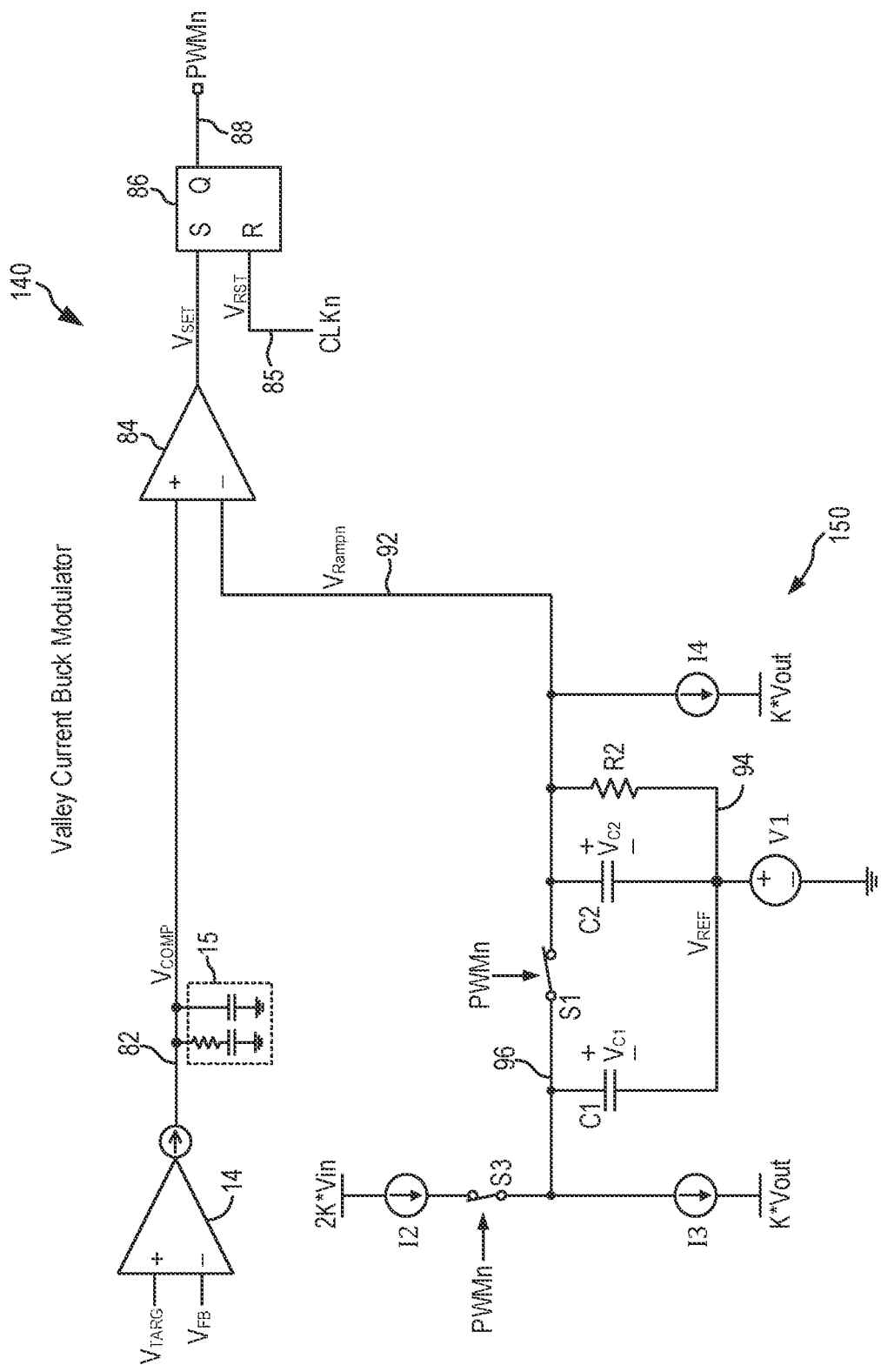
FIG. 11 is a schematic diagram of a ramp signal generator with slope compensation incorporated in a valley current mode buck modulator in alternate embodiments of the present invention.

FIG. 11 is a schematic diagram of a ramp signal generator with slope compensation incorporated in a valley current mode buck modulator in alternate embodiments of the present invention. In particular, FIG. 11 illustrates a ramp signal generator 150 incorporated into a valley current mode control buck modulator 140 in some examples. The valley current mode buck modulator 140 uses a synthesized current loop signal for the current control loop and does not require a sensed inductor current signal to be fed back to the modulator.

Referring to FIG. 11, the modulator 140 includes an error amplifier 14 receiving the feedback voltage $V_{FB}$ and the target voltage $V_{TARG}$ to generate an error signal $V_{COMP}$ on a node 82. In one example, the error amplifier 14 is a transconductance amplifier and generates an output current signal which is converted to a voltage signal by Loop filter 15 coupled to the output node 82. The error signal $V_{COMP}$ on node 82 is therefore a voltage signal in the present example. The error signal $V_{COMP}$ is coupled to the non-inverting input terminal of a modulating comparator 84. The ramp signal generator 150 generates a ramp signal $V_{RAMP}$ (node 92) which is provided to the inverting input terminal of the modulating comparator 84. The modulating comparator 84 generates the set signal $V_{SET}$ which is coupled to the Set input terminal of a latch circuit 86. The latch circuit 86 receives a clock signal CLK, generated by a voltage-controlled oscillator (not shown) in response to the error signal $V_{COMP}$, as the reset signal $V_{RST}$ which is coupled to the Reset input terminal of the latch circuit 86. In one example, the latch circuit 86 is a flip-flop circuit. The latch circuit 86 generates a pulse-width modulation signal PWM on an output node 88. In the case the modulator 140 is a multi-phase modulator, the schematic diagram in FIG. 11 is representative of a single phase n of the modulator 140. The modulating comparator 84 receives a ramp signal $V_{RAMPn}$ and generates the set signal for the latch circuit 86. The latch circuit 86 also receives the clock signal CLKn as the reset signal. The latch circuit 86 generates a pulse-width modulation signal PWMn on the output node 88 for the phase n of the multi-phase modulator.

The ramp signal generator 150 includes a switched capacitor circuit formed by capacitors C1 and C2 and switch S1 to generate a ramp signal with built-in slope compensation. The ramp signal generator 150 realizes ramp signal generation and slope compensation by using the switched capacitor circuit to divide the charge associated with the current mode signal during the down-ramp among the two capacitors and to share the charge associated with the current mode signal during the up-ramp, while conserving the total charge over a given switching cycle. As thus configured, capacitor C2 provides the ramp signal down-ramp and the capacitors C1 and C2 in parallel provide the ramp signal up-ramp.

The switch S1 is controlled by a signal indicative of the pulse-width modulation signal PWM. In particular, the switch S1 is controlled by the pulse-width modulation signal PWM so that the switch S1 is closed in response to the on-duration of the pulse-width modulation signal PWM and the switch S1 is open in response to the off-duration of the pulse-width modulation signal PWM.

The ramp signal generator 150 includes the capacitor C1 coupled between the node 96 and the node 94 and the capacitor C2 coupled between the node 92 and the node 94. The node 94 is biased to a reference voltage $V_{REF}$, such as through a voltage source V1. The ramp signal generator 150 includes a current source I2 providing a current proportional to the two times the input voltage $V_{IN}$ or $2K*V_{IN}$, K being a number greater than zero. The current source I2 is connected to node 96 through a switch S3, controlled by the PWM signal, to provide current to node 96. A resistor R2 is coupled in parallel with capacitor C2 to remove the DC component of the ramp signal at node 92, as described above.

The ramp signal generator 150 includes a current sink I3 providing a current proportional to the output voltage $V_{OUT}$ (or $K*V_{OUT}$) and a current sink I4 providing a current proportional to the output voltage $V_{OUT}$ (or $K*V_{OUT}$). The current sink I3 is directly connected to node 96 to supply current to node 96. Meanwhile, the current sink I4 is directly connected to node 92 to sink current from node 92.

In some embodiments, the ramp signal generator 150 is constructed using capacitors C1 and C2 having unequal capacitance values to facilitate divergence in the voltages on nodes 92 and 96 during the down-ramp asymmetrically to realize slope compensation. That is, in some embodiments, the capacitance ratio of capacitors C1/C2 is not 1. Alternately, the ramp signal generator 150 is constructed using current sink I3 and current sink I4 having unequal current values to divide the charge during the down-ramp asymmetrically to realize slope compensation. That is, in some embodiments, the current ratio of current sinks I3/I4 is not 1. In practice, either the capacitor ratio can be varied or the current sinks ratio can be varied to introduce the asymmetric charge division for realizing the slope compensation.

In operation, during the PWM on-duration, switches S1 and S3 are closed and charge is shared among capacitors C1 and C2. That is, capacitors C1 and C2 are connected in parallel and are connected to the current sources I2 as well as the current sinks I3 and I4. Nodes 92 and 96 are shorted together. As a result, the charge accumulated on capacitors C1 and C2 is shared and the ramp signal $V_{RAMP}$ becomes the weighted average of the capacitor voltages $V_{C1}$ and $V_{C2}$. As a result of the charge sharing, the ramp signal $V_{RAMP}$ ramps up with a ramp rate matching the current mode signal. That is, the ramp signal up-ramp has a slope of $K*(V_{IN}-V_{OUT})$. In ramp signal generator 150, the effective capacitance is doubled by using capacitors C1 and C2 in parallel, but the current sinks I3 and I4 provide a current proportional to two times the output voltage $V_{OUT}$. Therefore, the ramp rate is maintained at (Vin−Vout). The ramp signal $V_{RAMP}$ ramps up until the charge phase is terminated by the clock signal CLK. The PWM signal is reset by the clock signal CLK to initiate the discharge phase or off-duration.

During the discharge phase or the off-duration of the PWM signal, the switches S1 and S3 are open and the capacitors C1 and C2 are disconnected from each other. The capacitor C2 is charged by the current sink I4 having a current proportional to $K^*V_{OUT}$. With the switch S1 open, the ramp signal $V_{RAMP}$ (node 92) is the voltage $V_{C2}$ across the capacitor C2 and has a ramp rate proportional to $-V_{OUT}$. In this manner, so long as the ratio of I3/4 and/or the ratio of C1/2 is selected to cause divergence during the down-ramp, the ramp signal $V_{RAMP}$ (node 92) has a down-ramp incorporating slope compensation. The ramp signal $V_{RAMP}$ ramps down during the PWM off-duration or the discharge phase to provide a down-ramp with slope compensation to the modulating comparator 84.

Also during the PWM off-duration, the capacitor C1 accumulates the missing charge that would be put on the combined capacitor C1+C2 when slope compensation is not implemented so that charge conservation is maintained over the switching cycle. In particular, the capacitor C1 is being charged by the current sink I3 to a voltage proportional to $K^*V_{OUT}$. The voltage $V_{C1}$ on capacitor C1 ramps down to store the charge not included on capacitor C2 while switch S1 is open. With the capacitors C1 and C2 having unequal capacitance values, or current sinks I3 and I4 having unequal current values, the ramp rate for voltage $V_{C2}$ is different from the ramp rate for voltage $V_{C1}$. Thus, the down-ramp for capacitor C2 diverges from the down-ramp for capacitor C1. As a result, different amounts of charge are stored on capacitors C1 and C2 or in the case where C1 is different from C2, different voltages are generated; however, the total charge is conserved over the switching cycle.

Under the valley current control scheme, when the ramp signal $V_{RAMP}$ falls below the error signal $V_{COMP}$ (node 82), the modulating comparator 84 is triggered and the PWM signal is set. The PWM off-duration ends and the PWM on-duration begins for the next switching cycle. Accordingly, switches S1 and S3 are closed and the operation repeats as described above.

Accordingly, the ramp signal generator 150 is configured for a valley current mode buck modulator by dividing the charge fed to the capacitors C1 and C2 during the down-ramp and sharing the charge between the capacitors C1 and C2 during the up-ramp, and conserving the total charge over a given switching cycle to be independent of the dividing function. In this way, the ramp signal is generated with slope compensation built-in. In the case of the valley current mode buck modulator, the ramp signal generator 150 realizes charge division on the down-ramp by using unequal capacitor ratio (C1/C2≠1) or unequal current sink ratio (I3/I4≠1).

Figure 12:
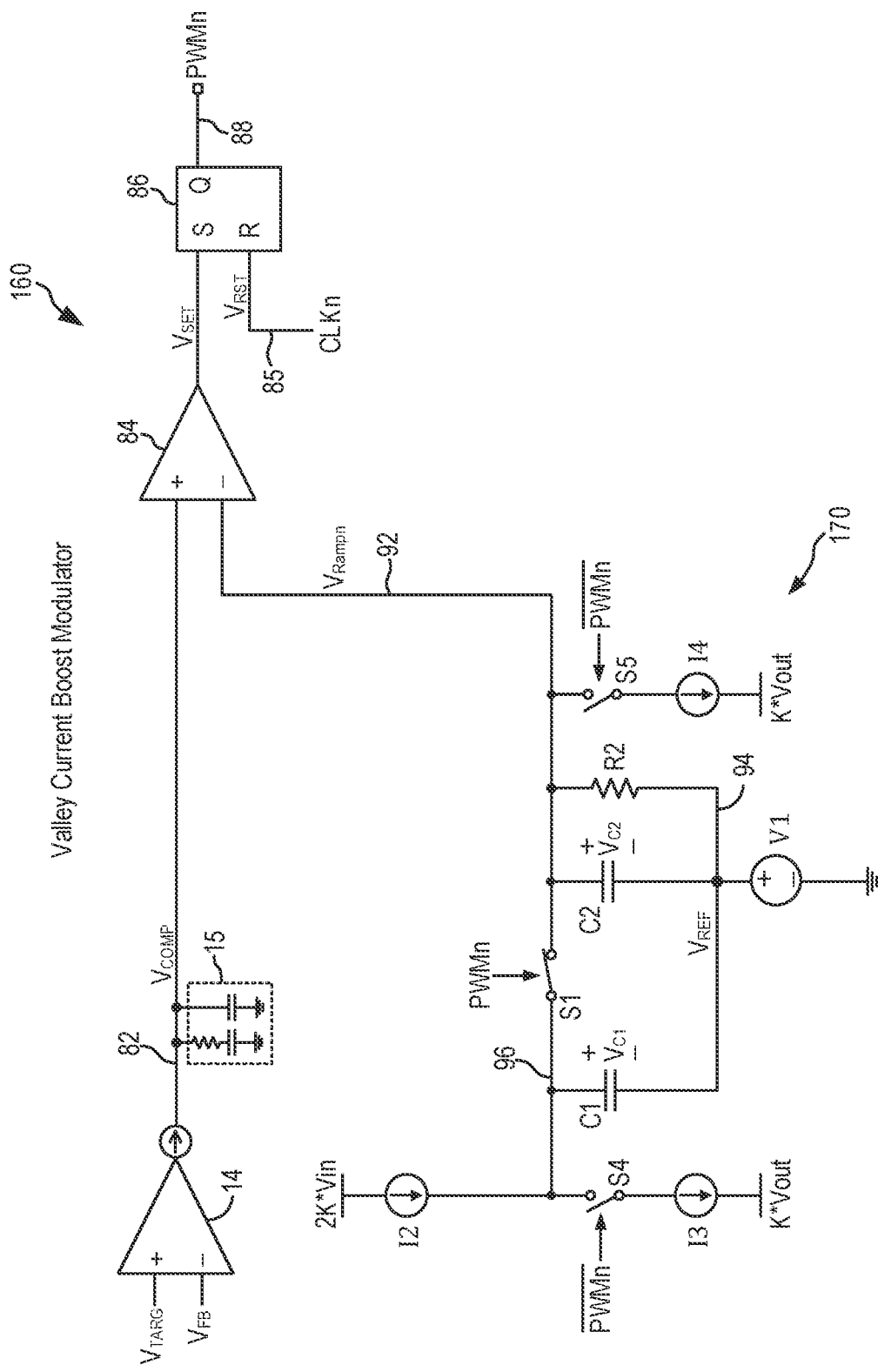
FIG. 12 is a schematic diagram of a ramp signal generator with slope compensation incorporated in a valley current mode boost modulator in alternate embodiments of the present invention.

FIG. 12 is a schematic diagram of a ramp signal generator with slope compensation incorporated in a valley current mode boost modulator in alternate embodiments of the present invention. In particular, FIG. 12 illustrates a ramp signal generator 170 incorporated into a valley current mode control boost modulator 160 in some examples. The valley current mode boost modulator 160 uses a synthesized current loop signal for the current control loop and does not require a sensed inductor current signal to be fed back to the modulator. Referring to FIG. 12, the ramp signal generator 170 is incorporated into the valley current mode boost modulator 160 in substantially the same manner as the valley current mode buck modulator 140 of FIG. 11. Like elements in FIGS. 11 and 12 are given like reference numerals and description will not be repeated.

The ramp signal generator 170 includes a switched capacitor circuit formed by capacitors C1 and C2 and switch S1 to generate a ramp signal with built-in slope compensation. The ramp signal generator 170 realizes ramp signal generation and slope compensation by using the switched capacitor circuit to divide the charge associated with the current mode signal during the down-ramp and the capacitors C1 and C2 in parallel provide the ramp signal up-ramp.

The switch S1 is controlled by a signal indicative of the pulse-width modulation signal PWM. In particular, the switch S1 is controlled by the pulse-width modulation signal PWM so that the switch Si is closed in response to the on-duration of the pulse-width modulation signal PWM and the switch S1 is open in response to the off-duration of the pulse-width modulation signal PWM.

The ramp signal generator 170 includes the capacitor C1 coupled between the node 96 and the node 94 and the capacitor C2 coupled between the node 92 and the node 94. The node 94 is biased to a reference voltage $V_{REF}$, such as through a voltage source V1. The ramp signal generator 170 includes a current source I2 providing a current proportional to the two times the input voltage $V_{IN}$ or $2K^*V_{IN}$, K being a number greater than zero. The current source I2 is directly connected to node 96 to provide current to node 96. A resistor R2 is coupled in parallel with capacitor C2 to remove the DC component of the ramp signal at node 92, as described above.

The ramp signal generator 170 includes a current sink I3 providing a current proportional to the output voltage $V_{OUT}$ (or $K^*V_{OUT}$) and a current sink I4 providing a current proportional to the output voltage $V_{OUT}$ (or $K^*V_{OUT}$). The current sink I3 is connected to node 96 through a switch S4, controlled by the inverse of the PWM signal, to supply current to node 96. Meanwhile, the current sink I4 is connected to node 92 through a switch S5, controlled by the inverse of the PWM signal, to supply current to node 92.

In some embodiments, the ramp signal generator 170 is constructed using equal capacitor ratio and equal current sink ratio. That is, capacitor C1 and capacitor C2 have the same capacitance values and current sink I3 and current I4 have the same current values. In other embodiments, the ramp signal generator 170 may be constructed using capacitors C1 and C2 having unequal capacitance values to adjust the amount of slope compensation during the down-ramp. That is, in some embodiments, the capacitance ratio of capacitors C1/C2 is not 1. Alternately, the ramp signal generator 170 may be constructed using current sink I3 and current sink I4 having unequal current values to adjust the amount of slope compensation during the down-ramp. That is, in some embodiments, the current ratio of current sinks I3/I4 is not 1. In practice, either the capacitor ratio can be varied and/or the current sinks ratio can be varied to introduce the asymmetric charge division for adjusting the slope compensation.

In operation, during the PWM on-duration, switch S1 is closed and switches S4 and S5 are open. Charge is shared among capacitors C1 and C2. That is, capacitors C1 and C2 are connected in parallel and are connected to the current source I2. Nodes 92 and 96 are shorted together. As a result, the charge is accumulated on the combined capacitance of C1+C2, and the ramp signal $V_{RAMP}$ is equal to the capacitor voltages $V_{C1}$ and $V_{C2}$. As a result, the ramp signal $V_{RAMP}$ ramps up with a ramp rate matching the current mode signal. That is, the ramp signal up-ramp has a slope of $K^*V_{IN}$. In ramp signal generator 170, the effective capacitance is doubled by using capacitors C1 and C2 in parallel, but the current source I2 provide a current proportional to two times the input voltage $V_{IN}$. Therefore, the ramp rate is maintained as proportional to Vin. The ramp signal $V_{RAMP}$ ramps up until the charge phase is terminated by the clock signal CLK.

The PWM signal is reset by the clock signal CLK to initiate the discharge phase or off-duration.

During the discharge phase or the off-duration of the PWM signal, the switch S1 is open and switches S4 and S5 are closed and the capacitors C1 and C2 are disconnected from each other. The capacitor C2 is charged by the current sink I4 having a current proportional to $K^*V_{OUT}$. With the switch S1 open, the ramp signal $V_{RAMP}$ (node 92) is the voltage $V_{C2}$ across the capacitor C2 and has a ramp rate proportional to $-V_{OUT}$. In this manner, the ramp signal $V_{RAMP}$ (node 92) has a down-ramp incorporating slope compensation. The ramp signal $V_{RAMP}$ ramps down during the PWM off-duration or the discharge phase to provide a down-ramp with slope compensation to the modulating comparator 84.

Also during the PWM off-duration, the capacitor C1 accumulates the missing charge that would be put on combined capacitor C1+C2 when slope compensation is not implemented so that charge conservation is maintained over the switching cycle. In particular, the capacitor C1 is being charged by the current source I2 and the current sink I3 to a voltage proportional to $K^*(2Vin-V_{OUT})$. The voltage $V_{C1}$ on capacitor C1 ramps down to store the charge not included on capacitor C2 while switch S1 is open. The ramp rate for voltage $V_{C2}$ is different from the ramp rate for voltage $V_{C1}$, therefore, the down-ramp for capacitor C2 diverges from the down-ramp for capacitor C1. As a result, different amounts of charge are stored on capacitors C1 and C2; however, the total charge is conserved over the switching cycle.

Under the valley current control scheme, when the ramp signal $V_{RAMP}$ falls below the error signal $V_{COMP}$ (node 82), the modulating comparator 84 is triggered and the PWM signal is set. The PWM off-duration ends and the PWM on-duration begins for the next switching cycle. Accordingly, switch S1 is closed and switches S4 and S5 are open and the operation repeats as described above.

Accordingly, the ramp signal generator 170 is configured for a valley current mode boost modulator by dividing the charge fed to the capacitors C1 and C2 during the down-ramp and sharing the charge between the capacitors C1 and C2 during the up-ramp, and conserving the total charge over a given switching cycle to be independent of the dividing function. In this way, the ramp signal is generated with slope compensation built-in. In the case of the valley current mode boost modulator, the ramp signal generator 170 can adjust the charge division or the ramp rates on the down-ramp by using unequal capacitor ratio (C1/C2≠1) or unequal current sink ratio (I3/I4≠1).

Figure 13:
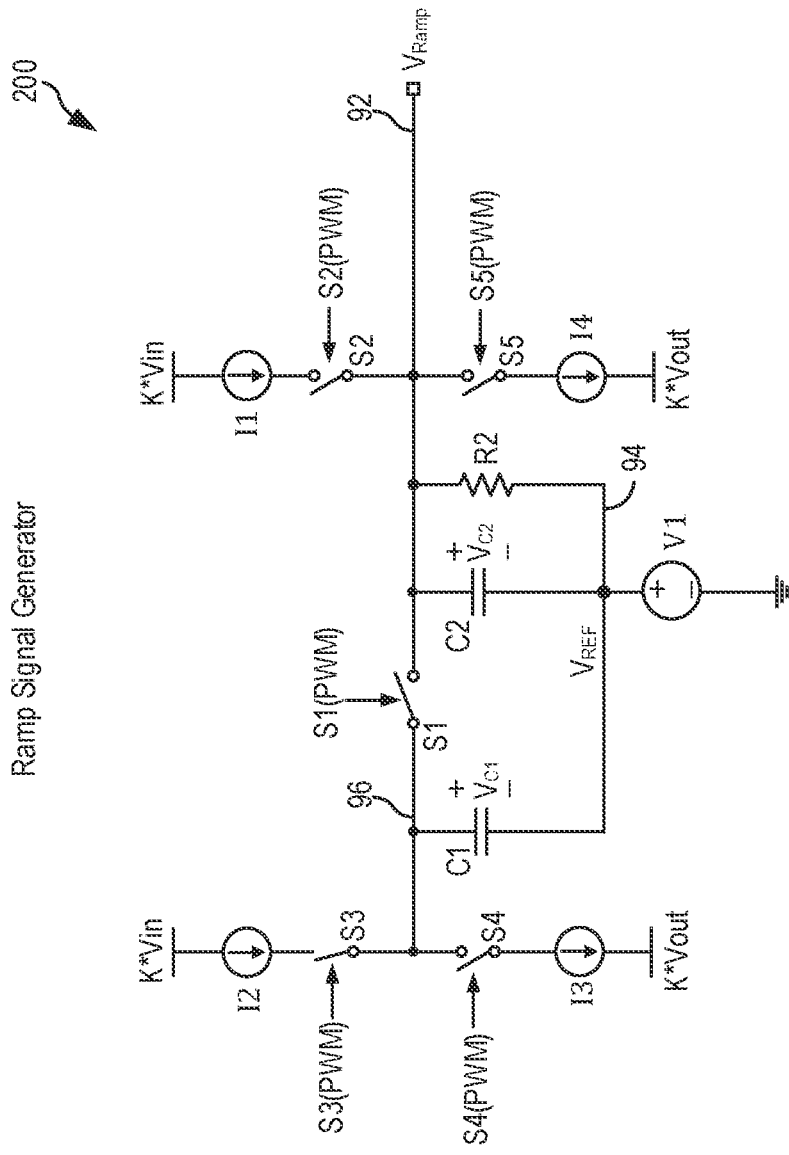
FIG. 13 is a schematic diagram of a ramp signal generator with slope compensation in alternate embodiments of the present invention.

FIG. 13 is a schematic diagram of a ramp signal generator with slope compensation in alternate embodiments of the present invention. FIG. 13 illustrates a ramp signal generator 200 which can be incorporated in a current mode modulator for generating the ramp signal to use as the synthesized current mode signal for the current control loop of the modulator. In particular, FIG. 13 illustrates a generic ramp signal generator which can be modified to apply to different configurations of current mode modulators. For example, the ramp signal generator 200 of FIG. 13 can be modified to apply to peak current mode or valley current mode modulators. Furthermore, the ramp signal generator 200 can also be modified to apply to buck, boost or buck-boost modulator configurations.

Referring to FIG. 13, the ramp signal generator 200 includes a switched capacitor circuit formed by capacitors C1 and C2 and a switch S1 to generate a ramp signal with built-in slope compensation. The ramp signal generator 200 realizes ramp signal generation and slope compensation by using the switched capacitor circuit to divide the charge associated with the current mode signal during one portion of the ramp signal among the two capacitors and to share the charge associated with the current mode signal during the other portion of the ramp signal, while conserving the total charge over a given switching cycle. In operation, capacitor C2 provides one portion of the ramp signal and the capacitors C1 and C2 in parallel provide the other portion of the ramp signal.

The switch S1 is controlled by a signal S1(PWM) indicative of the pulse-width modulation signal PWM. In some embodiments, the control signal S1(PWM) for switch S1 is selected based on the current control mode of the modulator. For example, when the modulator implements peak current control mode, the control signal S1(PWM) is the inverse of the pulse-width modulation signal PWM. On the other hand, when the modulator implements valley current control mode, the control signal S1(PWM) is the pulse-width modulation signal PWM.

The ramp signal generator 200 includes the capacitor C1 coupled between the node 96 and the node 94 and the capacitor C2 coupled between the node 92 and the node 94. The node 94 is biased to a reference voltage $V_{REF}$, such as through a voltage source V1. A resistor R2 is coupled in parallel with capacitor C2 to remove the DC component of the ramp signal at node 92, as described above.

The ramp signal generator 200 includes a current source I1 providing a current proportional to the input voltage $V_{IN}$ or $K^*V_{IN}$, K being a number greater than zero. The current source I1 is connected to node 92 through a switch S2, controlled by the control signal S2(PWM) signal, to provide current to node 92. The control signal S2(PWM) can be the PWM signal or an inverse of the PWM signal or always on depending on implementation. The current source may also be omitted in some implementation.

The ramp signal generator 200 includes a current source I2 providing a current proportional to the input voltage $V_{IN}$ or $K^*V_{IN}$, K being a number greater than zero. The current source I2 is connected to node 96 through a switch S3, controlled by the control signal S3(PWM) signal, to provide current to node 96. The control signal S3(PWM) can be the PWM signal or an inverse of the PWM signal or always on depending on implementation. The current source I2 can be set to provide a current proportional to two times the input voltage $V_{IN}$ or $2K^*V_{IN}$ in the case that current source I1 is omitted.

The ramp signal generator 200 includes a current sink I4 providing a current proportional to the output voltage $V_{OUT}$ or $K^*V_{OUT}$, K being a number greater than zero. The current sink I4 is connected to node 92 through a switch S5, controlled by the control signal S5(PWM) signal, to sink current from node 92. The control signal S5(PWM) can be the PWM signal or an inverse of the PWM signal or always on depending on implementation. The current sink I4 may also be omitted in some implementation.

The ramp signal generator 200 includes a current sink I3 providing a current proportional to the output voltage $V_{OUT}$ (or $K^*V_{OUT}$), K being a number greater than zero. The current sink I3 is connected to node 96 through a switch S4, controlled by the control signal S4(PWM) signal, to sink current from node 96. The control signal S4(PWM) can be the PWM signal or an inverse of the PWM signal or always on depending on implementation. The current sink I3 can be set to provide a current proportional to two times the output voltage $V_{OUT}$ or $2K^*V_{OUT}$ in the case that current sink I4 is omitted.

In operation, the ramp signal generator 200 opens switch S1 to disconnect capacitors C1 and C2 during a portion of the ramp signal within a switching cycle while the ramp signal is ramping in one direction. The charge of the current mode signal corresponding to the ramp signal portion is divided and fed to the capacitors C1 and C2 through a given combination of switches S2 to S5 and current sources/sinks I1 to I4. Within the switching cycle, the ramp signal generator 200 closes switch S1 to connect capacitors C1 and C2 during the other portion of the ramp signal while the ramp signal is ramping in the other direction. The charge of the current mode signal corresponding to the ramp signal portion is shared by the capacitors C1 and C2 through S1 and ramped via a given combination of switches S2 to S5 and current sources/sinks I1 to I4. The total charge over a switching cycle is conserved. In this manner, a ramp signal is generated having an up-ramp or a down-ramp with slope compensation applied to the respective ramp portion.

More specifically, the ramp signal is generated by dividing the charge fed to the capacitors while ramping in one direction, and sharing the charge between the two capacitors while ramping in the other direction, and conserving the total charge over a given switching cycle to be independent of the dividing function. In this way, the ramp signal is generated with slope compensation built-in. In particular, the ramp signal generator 200 generates the ramp signal by separating the capacitors to apply non-conservation of charge over half of the switching cycle and shorting the capacitors together for the other half the cycle to share the charge, thereby conserving the total charge of the switching cycle. The ramp signal thus generated includes a ramp portion that matches the expected current mode signal, and one that does not, in order to realize optimal slope compensation.

In some embodiments, the ramp signal generator 200 can be constructed using capacitors C1 and C2 having unequal capacitance values to cause the voltages to deviate during the respective ramp portion asymmetrically to realize slope compensation or adjust the slope compensation amount. That is, in some embodiments, the capacitance ratio of capacitors C1/C2 is not 1. Alternately, the ramp signal generator 200 can be constructed using current source I1 and current source I2 having unequal current values to divide the charge during the respective ramp portion asymmetrically to realize slope compensation or adjust the slope compensation amount. In yet other embodiments, the ramp signal generator 200 can be constructed using current sink I3 and current sink I4 having unequal current values to divide the charge during the respective ramp portion asymmetrically to realize slope compensation or adjust the slope compensation amount. That is, in some embodiments, the current ratio of current sources I1/I2 is not 1 or the current ratio of current sinks I3/I4 is not 1. In practice, either the capacitor ratio can be varied or the current source, current sinks ratio can be varied to introduce the asymmetric charge division for realizing the slope compensation or adjusting the amount of slope compensation.

For example, the ramp signal generator 200 can be configured for a peak current mode buck modulator by omitting current sink I4 and omitting switch S4. The current sink I3 is set to be proportional to $2K*V_{OUT}$. The switch S1 is controlled by the inverse of the PWM signal. Meanwhile, the switches S2 and S3 are controlled by the PWM signal.

In another example, the ramp signal generator 200 can be configured for a peak current mode boost modulator by omitting current sink I4 and omitting switches S2 and S3. The current sink I3 is set to be proportional to $2K*V_{OUT}$. The switches S1 and S4 are both controlled by the inverse of the PWM signal.

In another example, the ramp signal generator 200 can be configured for a valley current mode buck modulator by omitting current sink I1 and omitting switches S4 an dS5. The current source I2 is set to be proportional to $2K*V_{IN}$. The switches S1 and S3 are controlled by the PWM signal.

In another example, the ramp signal generator 200 can be configured for a valley current mode boost modulator by omitting current sink I1 and omitting switch S3. The current source I2 is set to be proportional to $2K*V_{IN}$. The switch S1 is controlled by the PWM signal. Meanwhile, the switches S4 and S5 are controlled by the inverse of the PWM signal.

One of ordinary skilled in the art would appreciate that the combination of the current sources, current sinks and the switches can be modified or arranged to generate the ramp signal with slope compensation in different topologies of the current mode modulator. Furthermore, the current source/sink values and the capacitance values of capacitors C1 and C2 can be varied to adjust the amount of slope compensation provided.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided above along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The above detailed descriptions are provided to illustrate specific embodiments of the present invention and are not intended to be limiting. Numerous modifications and variations within the scope of the present invention are possible. The present invention is defined by the appended claims.

What is claimed is:

1. A ramp signal generator generating a slope compensated ramp signal for a current mode control modulator, the current mode control modulator generating a pulse-width modulation signal in response to a feedback voltage signal indicative of a regulated output voltage generated from an input voltage, the ramp signal generator comprising:

a first capacitor coupled between a first node and a second node, the second node being biased to a reference voltage and the first node providing the slope compensated ramp signal;

a second capacitor coupled between a third node and the second node; and a first switch coupled between the first node and the third node, the first switch being controlled by a first signal indicative of the pulse-width modulation signal, the first switch being open during a first duration of the pulse-width modulation signal and the first switch being closed during a second duration of the pulse-width modulation signal, a current circuit coupled to the first node and the third node and controlled by a second signal indicative of the pulse-width modulation signal to charge or discharge the first and third nodes, wherein the first capacitor, the second capacitor and the first switch form a switched capacitor circuit to generate the slope compensated ramp signal;

wherein in response to the first switch being open during the first duration of the pulse-width modulation signal, the ramp signal generator generates the slope compensated ramp signal having a first ramp portion by using the switched capacitor circuit to divide a charge associated with an expected current level of a current control loop of the current mode control modulator among the first capacitor and the second capacitor during the first duration of the pulse-width modulation signal, the first capacitor being disconnected from the second capacitor and providing the first ramp portion of the slope compensated ramp signal, and wherein in response to the first switch being closed during the second duration of the pulse-width modulation signal, the ramp signal generator generates the slope compensated ramp signal having a second ramp portion by using the switched capacitor circuit to share the charge associated with the expected current level of the current control loop of the current mode control modulator between the first capacitor and the second capacitor during the second duration of the pulse-width modulation signal, the first capacitor being connected to the second capacitor and the first and second capacitors providing the second ramp portion of the slope compensated ramp signal.

2. The ramp signal generator of claim 1, wherein the first duration of the pulse-width modulation signal comprises one of an on-duration or an off-duration of the pulse-width modulation signal and the second duration of the pulse-width modulation signal comprises the other one of the on-duration or the off-duration of the pulse-width modulation signal.

3. The ramp signal generator of claim 1, further comprising a resistor coupled between the first node and the second node.

4. The ramp signal generator of claim 1, wherein the current mode control modulator comprises a peak current mode buck modulator and the current circuit of the ramp signal generator circuit further comprises:

a first current source coupled to the first node through a second switch to provide a current proportional to the input voltage to the first node to charge the first capacitor, the second switch being controlled by a second signal indicative of the pulse-width modulation signal;

a second current source coupled to the third node through a third switch to provide a current proportional to the input voltage to the third node to charge the second capacitor, the third switch being controlled by a third signal indicative of the pulse-width modulation signal; and a first current sink providing a current proportional to two times the regulated output voltage to the third node to discharge the third node, wherein the first signal is an inverse of the pulse-width modulation signal and the second and third signals are inverse of the first signal, the first duration being an on-duration of the pulse-width modulation signal and the second duration being an off-duration of the pulse-width modulation signal, and wherein in response to the first switch being open and the second and third switches being closed during the on-duration of the pulse-width modulation signal, the first capacitor is being charged by the first current source and the first ramp portion of the ramp signal ramps up with a slope being proportional to the input voltage while the second capacitor is being charged by the second current source and the first current sink; and in response to the first switch being closed and the second and third switches being open during the off-duration of the pulse-width modulation signal, the first and second capacitors are connected and being discharged by the first current sink and the second ramp portion of the ramp signal ramps down with a slope being proportional to the regulated output voltage.

5. The ramp signal generator of claim 4, wherein the first capacitor and the second capacitor have a capacitance ratio of 1 or a capacitance ratio other than 1, and the first current source and the second current source have a ratio of 1 or other than 1.

6. The ramp signal generator of claim 1, wherein the current mode control modulator comprises a peak current mode boost modulator and the current circuit of the ramp signal generator circuit further comprises:

a first current source coupled to the first node to provide a current proportional to the input voltage to the first node to charge the first node;

a second current source coupled to the third node to provide a current proportional to the input voltage to the third node to charge the third node; and a first current sink coupled to the third node through a fourth switch to provide a current proportional to two times the regulated output voltage to the third node to discharge the third node, the fourth switch being controlled by a fourth signal indicative of the pulse-width modulation signal, wherein the first and fourth signals are inverse of the pulse-width modulation signal, the first duration being an on-duration of the pulse-width modulation signal and the second duration being an off-duration of the pulse-width modulation signal, and wherein in response to the first and fourth switches being open during the on-duration of the pulse-width modulation signal, the first capacitor is being charged by the first current source and the first ramp portion of the ramp signal ramps up with a slope being proportional to the input voltage while the second capacitor is being charged by the second current source; and in response to the first and fourth switches being closed during the off-duration of the pulse-width modulation signal, the first and second capacitors are connected and being discharged by the first current sink and the second ramp portion of the ramp signal ramps down with a slope being proportional to the difference of the input voltage and the regulated output voltage.

7. The ramp signal generator of claim 6, wherein the first capacitor and the second capacitor have a capacitance ratio other than 1, and the first current source and the second current source have a ratio other than 1.

8. The ramp signal generator of claim 1, wherein the current mode control modulator comprises a valley current mode buck modulator and the current circuit of the ramp signal generator circuit further comprises:

a second current sink coupled to the first node to provide a current proportional to the regulated output voltage to the first node to discharge the first node;

a second current source coupled to the third node through a third switch to provide a current proportional to the two times the input voltage to the third node to charge the third node, the third switch being controlled by a third signal indicative of the pulse-width modulation signal; and a first current sink providing a current proportional to two times the regulated output voltage to the third node to discharge the third node, wherein the first and third signals comprise the pulse-width modulation signal, the first duration being an off-duration of the pulse-width modulation signal and the second duration being an on-duration of the pulse-width modulation signal, and wherein in response to the first and third switches being open during the off-duration of the pulse-width modulation signal, the first capacitor is being discharged by the second current sink and the first ramp portion of the ramp signal ramps down with a slope being proportional to the regulated output voltage while the second capacitor is being discharged by the first current sink; and in response to the first and third switches being closed during the off-duration of the pulse-width modulation signal, the first and second capacitors are connected and being charged by the second current source and the first and second current sinks, and the second ramp portion of the ramp signal ramps up with a slope being proportional to the difference of the input voltage and the regulated output voltage.

9. The ramp signal generator of claim 8, wherein the first capacitor and the second capacitor have a capacitance ratio other than 1, and the first current sink and the second current sink have a ratio other than 1.

10. The ramp signal generator of claim 1, wherein the current mode control modulator comprises a valley current mode boost modulator and the current circuit of the ramp signal generator circuit further comprises:

a second current sink coupled to the first node through a fifth switch to provide a current proportional to the regulated output voltage to the first node to discharge the first node, the fifth switch being controlled by a fifth signal indicative of the pulse-width modulation signal;

a second current source coupled to the third node to provide a current proportional to the two times the input voltage to the third node to charge the third node; and a first current sink providing a current proportional to two times the regulated output voltage to the third node through a fourth switch to discharge the third node, the fourth switch being controlled by a fourth signal indicative of the pulse-width modulation signal, wherein the first signal is an inverse of the pulse-width modulation signal and the fourth and fifth signals are inverse of the first signal, the first duration being an off-duration of the pulse-width modulation signal and the second duration being an on-duration of the pulse-width modulation signal, and wherein in response to the first switch being open and the fourth and fifth switches being closed during the off-duration of the pulse-width modulation signal, the first capacitor is being discharged by the second current sink and the first ramp portion of the ramp signal ramps down with a slope being proportional to the regulated output voltage while the second capacitor is being charged by the second current source and the first current sink; and in response to the first switch being closed and the fourth and fifth switches being open during the on-duration of the pulse-width modulation signal, the first and second capacitors are connected and being charged by the second current source, and the second ramp portion of the ramp signal ramps up with a slope being proportional to the input voltage.

11. The ramp signal generator of claim 10, the first capacitor and the second capacitor have a capacitance ratio of 1 or a capacitance ratio other than 1, and the first current sink and the second current sink have a ratio of 1 or other than 1.

12. A method of generating a slope compensated ramp signal in a current mode control modulator, the current mode control modulator generating a pulse-width modulation signal in response to a feedback voltage signal indicative of a regulated output voltage generated from an input voltage, the pulse-width modulation signal having a first duration and a second duration, the method comprising:

providing a switched capacitor circuit comprising a first capacitor switchably connected to a second capacitor by a switch controlled by a first signal indicative of the pulse-width modulation signal, the first and second capacitors being charged and discharged by a current circuit controlled by a second signal indicative of the pulse-width modulation signal;

generating, using the switched capacitor circuit, a first ramp portion of the slope compensated ramp signal by dividing a charge associated with an expected current level of a current control loop of the current mode control modulator among the first and second capacitors during the first duration of the pulse-width modulation signal; and generating, using the switched capacitor circuit, a second ramp portion of the slope compensated ramp signal by sharing the charge associated with the expected current level of the current control loop of the current mode control modulator between the first and second capacitors during the second duration of the pulse-width modulation signal; and providing the first ramp portion and the second ramp portion as the slope compensated ramp signal.

13. The method of claim 12, wherein the first duration of the pulse-width modulation signal comprises one of an on-duration or an off-duration of the pulse-width modulation signal and the second duration of the pulse-width modulation signal comprises the other one of the on-duration or the off-duration of the pulse-width modulation signal.

14. The method of claim 12, wherein generating the first ramp portion of the slope compensated ramp signal comprises disconnecting the first capacitor from the second capacitor and providing at the first capacitor the first ramp portion of the slope compensated ramp signal; and wherein generating the second ramp portion of the slope compensated ramp signal comprises connecting the first capacitor to the second capacitor and providing at the first and second capacitors the second ramp portion of the slope compensated ramp signal.

15. The method of claim 14, wherein the current mode control modulator comprises a peak current mode buck modulator and the method further comprises:

in response to the switched capacitor circuit and the current circuit being controlled by the first and second signals respectively, generating at the first capacitor an up-ramp as the first ramp portion of the slope compensated ramp signal during an on-duration of the pulse-width modulation signal, the up-ramp of the ramp signal having a slope proportional to the input voltage;

storing charge proportional to the difference between the input voltage and two times the regulated output voltage during the on-duration of the pulse-width modulation signal;

equalizing the stored charge on the first and second capacitors in response to the on-duration of the pulse width modulation signal being terminated; and generating at the first and second capacitors a down-ramp as the second ramp portion of the slope compensated ramp signal during an off-duration of the pulse-width modulation signal, the down-ramp of the ramp signal having a slope proportional to the regulated output voltage.

16. The method of claim 15, wherein the first capacitor and the second capacitor have a capacitance ratio of 1 or a capacitance ratio other than 1.

17. The method of claim 14, wherein the current mode control modulator comprises a peak current mode boost modulator and the method further comprises:

in response to the switched capacitor circuit and the current circuit being controlled by the first and second signals respectively, generating at the first capacitor an up-ramp as the first ramp portion of the slope compensated ramp signal during an on-duration of the pulse-width modulation signal, the up-ramp of the ramp signal having a slope proportional to the input voltage;

storing charge proportional to the input voltage during the on-duration of the pulse-width modulation signal;

equalizing the stored charge on the first and second capacitors in response to the on-duration of the pulse width modulation signal being terminated; and generating at the first and second capacitors a down-ramp as the second ramp portion of the slope compensated ramp signal during an off-duration of the pulse-width modulation signal, the down-ramp of the ramp signal having a slope proportional to a difference of the input voltage and the regulated output voltage.

18. The method of claim 17, wherein the first capacitor and the second capacitor have a capacitance ratio other than 1.

19. The method of claim 14, wherein the current mode control modulator comprises a valley current mode buck modulator and the method further comprises:

in response to the switched capacitor circuit and the current circuit being controlled by the first and second signals respectively, generating at the first capacitor a down-ramp as the first ramp portion of the slope compensated ramp signal during an off-duration of the pulse-width modulation signal, the down-ramp of the ramp signal having a slope inversely proportional to the regulated output voltage;

storing charge proportional to the regulated output voltage during the off-duration of the pulse-width modulation signal;

equalizing the stored charge on the first and second capacitors in response to the off-duration of the pulse width modulation signal being terminated; and generating at the first and second capacitors an up-ramp as the second ramp portion of the slope compensated ramp signal during an on-duration of the pulse-width modulation signal, the up-ramp of the ramp signal having a slope proportional to a difference of the input voltage and the regulated output voltage.

20. The method of claim 14, wherein the current mode control modulator comprises a valley current mode boost modulator and the method further comprises:

in response to the switched capacitor circuit and the current circuit being controlled by the first and second signals respectively, generating at the first capacitor a down-ramp as the first ramp portion of the slope compensated ramp signal during an off-duration of the pulse-width modulation signal, the down-ramp of the ramp signal having a slope inversely proportional to the regulated output voltage;

storing charge proportional to a difference of two times the input voltage and the regulated output voltage during the off-duration of the pulse-width modulation signal;

equalizing the stored charge on the first and second capacitors in response to the off-duration of the pulse width modulation signal being terminated; and generating at the first and second capacitors an up-ramp as the second ramp portion of the slope compensated ramp signal during an on-duration of the pulse-width modulation signal, the up-ramp of the ramp signal having a slope proportional to the input voltage.

* * * * *